United States Patent
Yamamoto et al.

[11] Patent Number: 5,883,988
[45] Date of Patent: Mar. 16, 1999

[54] OPTICAL MODULE INCLUDING A PHOTORECEPTION DEVICE

[75] Inventors: Naoki Yamamoto; Masaaki Norimatsu; Goji Nakagawa; Seimi Sasaki, all of Kawasaki, Japan

[73] Assignee: Fujitsu Limited, Kawasaki, Japan

[21] Appl. No.: 825,033

[22] Filed: Mar. 26, 1997

[30] Foreign Application Priority Data

May 13, 1996 [JP] Japan .................................. 8-118069

[51] Int. Cl.$^6$ .................................. G02B 6/12; G01J 1/04
[52] U.S. Cl. .................................. 385/14; 385/49; 385/40; 385/88; 385/130; 385/131; 250/227.15
[58] Field of Search .................................. 385/14, 12, 49, 385/47, 52, 40, 130, 131, 133, 88, 92, 94, 31; 250/227.15

[56] References Cited

U.S. PATENT DOCUMENTS

| | | |
|---|---|---|
| 4,358,676 | 11/1982 | Childs et al. .................... 385/14 X |
| 4,897,711 | 1/1990 | Blonder et al. .................... 385/88 X |
| 5,073,003 | 12/1991 | Clark .................... 385/88 X |
| 5,416,870 | 5/1995 | Chun et al. .................... 385/88 |
| 5,446,814 | 8/1995 | Kuo et al. .................... 385/88 X |
| 5,577,142 | 11/1996 | Mueller-Fiedler et al. .................... 385/47 |
| 5,627,931 | 5/1997 | Ackley et al. .................... 385/88 |
| 5,701,374 | 12/1997 | Makiuchi .................... 385/49 |

FOREIGN PATENT DOCUMENTS 2521349  10/1990  Japan .................................. 385/14 X

*Primary Examiner*—Brian Healy
*Attorney, Agent, or Firm*—Armstrong, Westerman, Hattori, McLeland & Naughton

[57] ABSTRACT

A photoreception device includes an oblique surface on a semiconductor substrate for causing a deflection of an optical beam incident thereto and a photodetection region provided on a first side of the semiconductor substrate for detecting the deflected optical beam, the photodetection region including a first electrode, wherein the photoreception device further includes a second electrode for biasing the photodetection region an a second, opposite side of the semiconductor substrate.

30 Claims, 32 Drawing Sheets

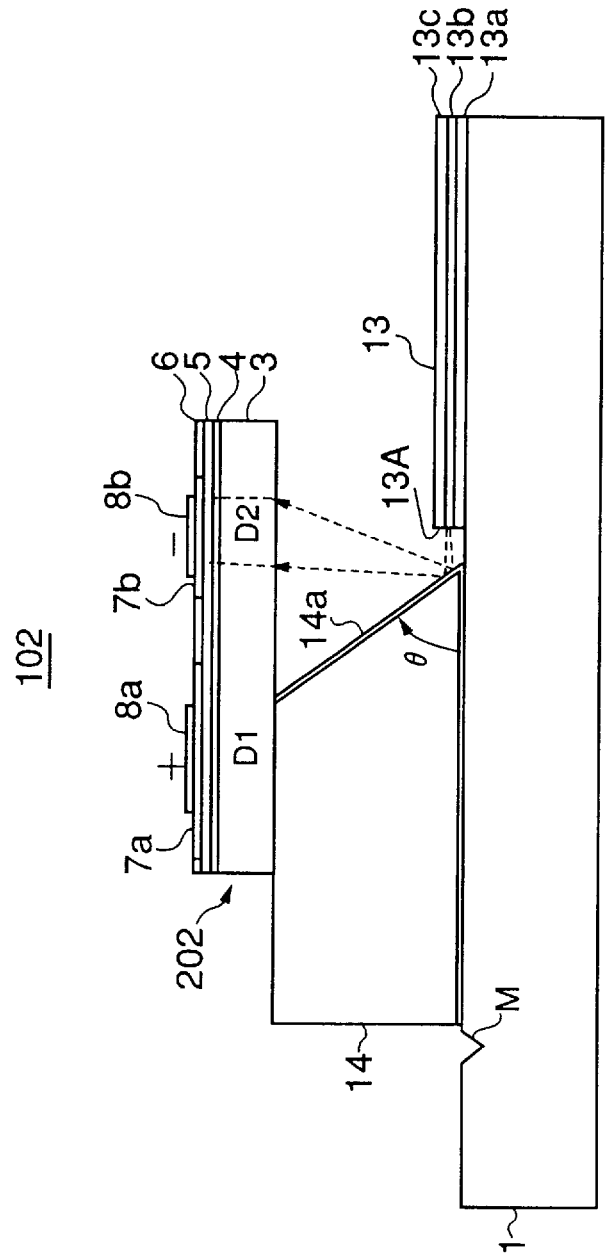

326

327

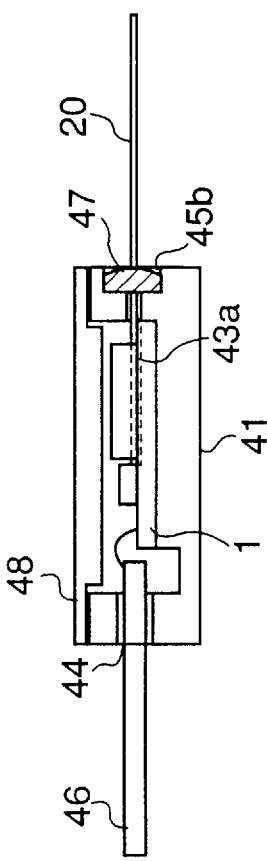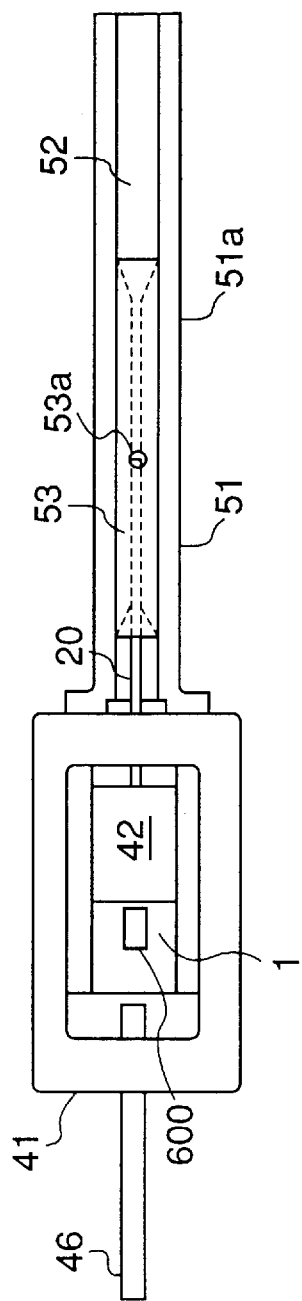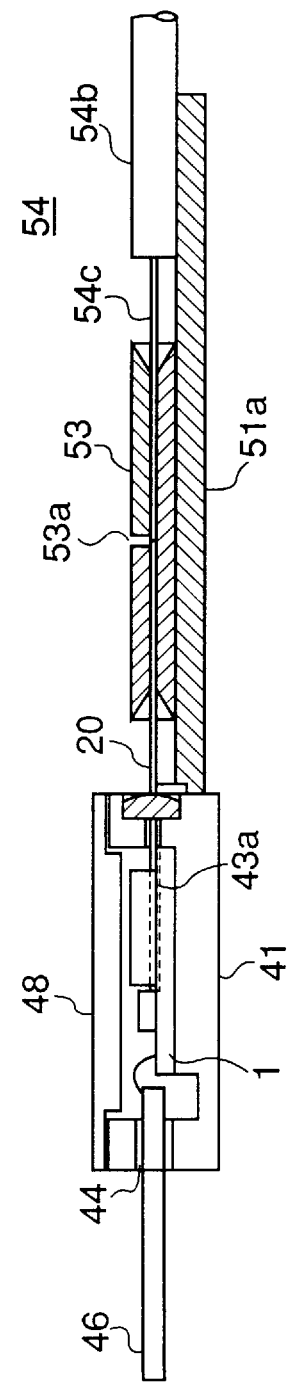

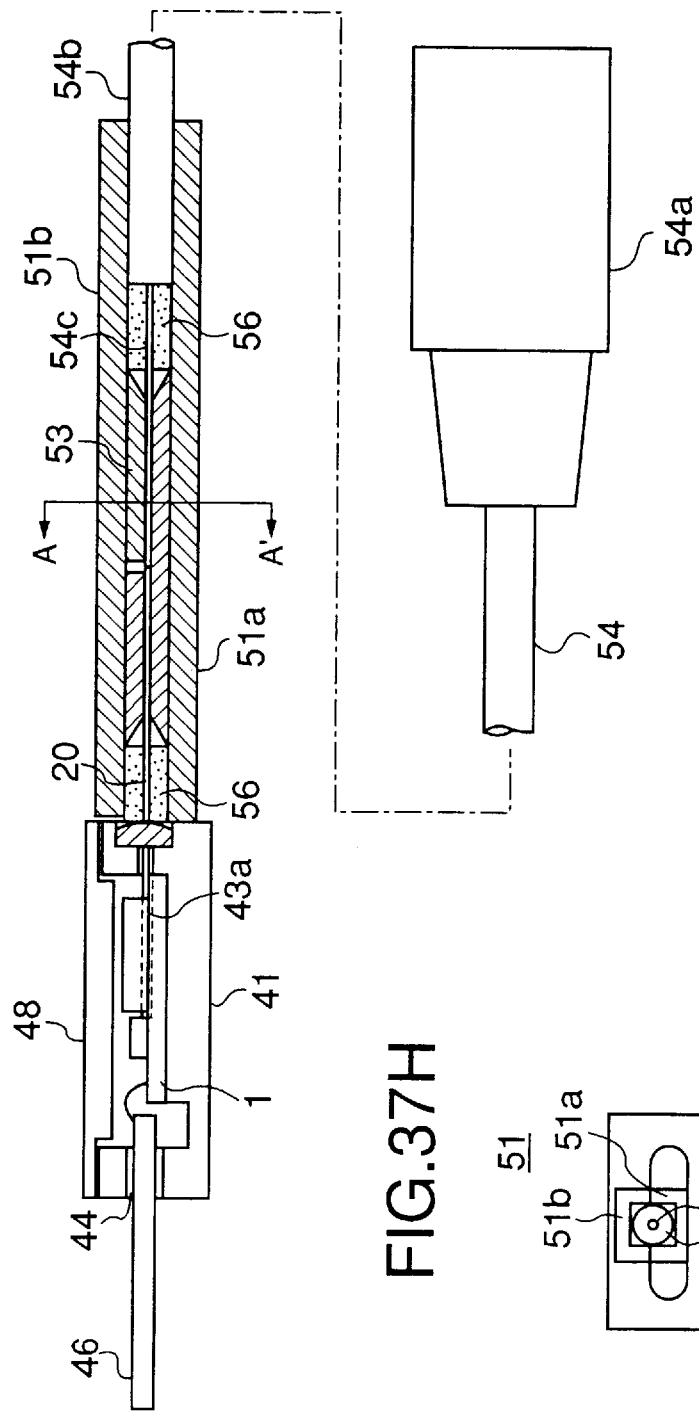

OPTICAL MODULE INCLUDING A PHOTORECEPTION DEVICE

TECHNICAL FIELD

The present invention relates to a photoreception device and an optical module including a photoreception device. Further, the present invention relates to an optical module assembly formed of such an optical module.

More specifically, the photoreception device of the present invention is a device of the type that includes an oblique surface on a device substrate, on which the photoreception device is formed, in alignment with an optical path of an incident optical beam, which is directed so as to impinge upon the device substrate. Thereby, the oblique surface causes a reflection or refraction of the incident optical beam to a side of the device substrate where a junction region is formed.

BACKGROUND OF THE INVENTION

With recent expansion of use of optical fibers in subscriber systems, there is a persisting and stringent demand for reduced size and cost of optical modules. In order to meet for such a stringent demand, it is necessary to simplify the connection between an optical semiconductor device and an optical waveguide or optical fiber in the optical module, such that the optical connection is achieved easily. In the same context, it is necessary to simplify the construction of the optical module and an optical module assembly, such that the optical semiconductor devices can be integrated with a large integration density.

FIGS. 1A shows an example of a conventional optical module 101 of the type that is adapted for receiving an incident optical beam at a rear side of a photoreception device.

Referring to FIG. 1A, the optical module 101 includes a support substrate 1 of Si that holds thereon an optical fiber 20. The support substrate 1 further supports thereon a sub-mount 2 typically formed of a ceramic material in a vertical state, wherein the sub-mount 2 supports thereon a photoreception device 201 such that a photoreception region of the device 201 faces an edge surface 20A of the optical fiber 20.

The photoreception device 201, on the other hand, includes a device substrate 3 of n-type InP, wherein a buffer layer 4 of $n^+$-type InP and an optical absorption layer 5 of undoped InGaAs are formed consecutively on the device substrate 3 by a planar process. On the optical absorption layer 5, a layer 6 of $n^-$-type InP is formed, while the InP layer 6 thus formed is further formed with p-type InP regions 7a and 7b as a result of diffusion of Zn into the layer 6 in correspondence to the foregoing regions 7a and 7b. The diffusion regions 7a and 7b are then covered by p-type ohmic electrodes 8a and 8b respectively, wherein each of the ohmic electrodes 8a and 8b is formed by a deposition of an Au/Zn/Au stacked structure, followed by an annealing process thereof.

The InP layer 6 of the $n^-$-type is covered by a thin insulation film (not shown) of SiN or $SiO_2$, and an insulation layer 12 of a polyimide is formed further on the insulation film. The insulation layer 12 as well as the insulation film underneath are then formed with contact holes respectively in correspondence to the foregoing p-type diffusion regions 7a and 7b, and metal bumps 9a and 9b, each having a Ti/Pt/Au/Sn/Au stacked structure or a Ti/Pt/AuSn stacked structure, or alternatively of a Ti/Pt/Sn/Au stacked structure, are formed respectively on the p-type diffusion regions 7a and 7b. Thereby, the foregoing p-type electrodes 8a and 8b are formed in contact with the metal bumps 9a and 9b respectively. Further, the device substrate 3 is formed with a microlens 10 by an etching process on a rear side of thereof in correspondence to the p-type diffusion region 7b. The microlens 10 thus formed is covered by an anti-reflection coating 3b.

The sub-mount 2, on the other hand, carries thereon conductor patterns 2c and 2d, and the foregoing metal bumps 9a and 9b of the photoreception device 201 are flip-chip mounted on the conductor patterns 2c and 2d respectively. It should be noted that the conductor pattern 2c is connected to a conductor pattern 2a on the rear side of the sub-mount 2 by way of a via-hole 2b extending through the sub-mount 2, and a positive dc voltage E is applied to the conductor pattern 2a. On the other hand, the conductor pattern 2d is connected to a conductor pattern 2f on the foregoing rear side of the sub-mount 2 by way of a via-hole 2e extending also through the sub-mount 2, and a load $R_L$ is connected to the conductor pattern 2f.

The optical module 101 is thus formed by mounting the sub-mount 2 on the support substrate 1 such that the photoreception device 201 establishes an optical alignment with a core 20a of the optical fiber 20.

FIG. 1B shows an equivalent circuit diagram of the photoreception device 201.

Referring to FIG. 1B, the photoreception device 201 includes two pin diodes D1 and D2 formed respectively between the n-type buffer layer 4 of InP and the p-type diffusion region 7a of InP and between the n-type buffer layer 4 of InP and the p-type diffusion region 7b of InP, wherein the buffer layer 4 is common to the pin diode D1 and the pin diode D2.

In the circuit of FIG. 1B, the diode D1 is biased in the forward direction and acts as a current source. The p-type diffusion region 7a typically has a very large area (300×200 μm, for example) and supplies a large drive current. While the diode D1 has a relatively large junction capacitance Cp of about 6 pF, for example, this large junction capacitance is tolerable for a current source.

On the other hand, the diode D2 is reverse-biased and acts as a photodiode forming the photoreception region. Thus, the optical beam emitted from the edge surface 20A of the optical fiber 20 is focused on the part of the optical absorption layer 5 where the diode D2 is formed by the microlens 10. In response to such an exposure to the optical beam, electron-hole pairs are excited in the optical absorption layer 5 efficiently, and the electrons and holes thus excited cause a drifting in respective, opposite directions in accordance with the electric field induced between the p-type electrodes 8a and 8b. In other words, a photo-current flows through the diode D2. As the p-type diffusion region 7b has a very small size, typically smaller than about 40 μm in diameter, the junction capacitance of the diode D2 is also very small, typically about 0.15 pF. Thus, a very high response is obtained at the load $R_L$ for the optical detection.

On the other hand, the optical module 101 of FIG. 1B has a drawback, associated with the complex support structure of the photoreception device 201, in that the proper alignment of the photoreception device 201 with respect to the optical waveguide or optical fiber 20 is difficult. While it is true that the sub-mount 2 itself, mounted directly on the support substrate 1, may be positioned on the support substrate 1 by using a marker M formed on the support substrate 1, the desired proper positioning of the photoreception device 201 with respect to the optical fiber 20 is still difficult due to the mounting error between the photoreception device 201 and the sub-mount 2. In the module 101 of FIG. 1A, therefore, it has been necessary to adjust the position of the optical fiber 20 on the support substrate 1 with a sub-micron precision by monitoring the output of the photoreception device 201 while applying a bias thereto.

FIG. 2 shows another conventional optical module 102 that also receives an incident optical beam at a rear side of a photoreception device.

Referring to FIG. 2, the photoreception module 102 includes an optical waveguide 13 on the support substrate 1, and a photoreception device 202 is held above the support substrate 1 by means of an intervening sub-mount 14. The sub-mount 14 includes an oblique surface, and the oblique surface reflects an incident optical beam toward the rear side of the photoreception device 202.

It should be noted that the optical waveguide is formed of glass or semiconductor layers formed on the support substrate 1 of Si by way of a CVD process and has a structure in which a core layer 13b having a refractive index $n_1$ is sandwiched vertically or laterally by claddings 13a and 13c each having a refractive index $n_2$ smaller than the refractive index $n_1$.

The photoreception device 202 has a structure generally identical with that of the photoreception device 201 except that the microlens 10 is omitted. Further, the photodetection region D2 corresponding to the p-type diffusion region 7b has a slightly increased size in correspondence to the increased beam size of the incident optical beam, which may be a slightly divergent optical beam.

It should be noted that the sub-mount 14 has mutually parallel upper and lower major surfaces, and holds the photoreception device 202 above the support substrate 1 as noted previously. Further, the sub-mount 14 includes an oblique surface at the right side wall thereof with an oblique angle $\Theta$ with respect to the support substrate 1, wherein the oblique surface is covered by a reflective metal coating 14a. Thereby, the optical beam emitted from an edge surface 13A of the optical waveguide 13 is reflected by the foregoing oblique surface 14a and reaches the optical absorption layer 5 forming the diode D1 after entering the rear surface of the photoreception device 202.

In the optical module 102, it should be noted that the positional relationship between the optical waveguide 13 and the support substrate 1 is fixed. No degree of freedom exists here. Further, the photodiode D2 of the photoreception device 202 has a relatively large area for receiving the incident optical beam. Thus, the optical module 102 can be fabricated relatively easily, without monitoring the photoreception output current, by using a marker provided on the support substrate 1. However, the foregoing optical module 102 that uses an additional, intervening sub-mount 14, has a drawback in that the number of the parts in the module is increased and the mounting process is complicated.

Thus, the foregoing prior art devices, each using an intermediate sub-mount 2 or 14 in combination with a photoreception device 201 or 202, both of which being of the type that receives the incident optical beam at the rear substrate surface, have suffered from the problem of increased number of parts, complex process of assembling the optical module, difficulty in reducing the size, and the like.

On the other hand, there is further proposed an optical module 103 shown in FIG. 3A, in which the optical module 103 includes a photoreception device 203 mounted on the support substrate 1 on which the optical waveguide 13 is formed monolithically, similarly to the optical module 102 of FIG. 2. In the optical module 103, the photoreception device 203 is flip-chip mounted on the support substrate 1 via a solder layer 19, wherein the photoreception device 203 is formed with a flat oblique surface 3A at the edge of the device substrate 3 so as to face the edge 13A of the optical waveguide 13 with an angle $\Theta_1$. Thereby, the optical beam emitted from the edge surface 13A of the optical waveguide 13 is refracted by the oblique surface 3A toward the junction region 7b where the photodiode D2 is formed.

FIG. 3B shows another conventional optical module 104 that includes the optical waveguide 13 on the support substrate 1 monolithically similarly to the previous example of FIG. 3A, wherein the optical module 104 further includes a photoreception device 204 on the support substrate 1. The photoreception device 204 is formed on the device substrate 3 that has a vertical side wall with respect to the major surface of the support substrate 1, wherein the photoreception device 204 is disposed such that the foregoing vertical side wall faces the edge surface 13A of the optical waveguide 13. Thereby, the optical beam emitted from the foregoing edge surface 13A enters the device substrate 3 of the photoreception device 204 at the vertical side wall.

Further, the photoreception device 204 includes the oblique surface 3A generally at a center of the device substrate 3 with an angle $\Theta_2$ with respect to the principal surface of the support substrate 1, wherein the oblique surface 3A of the device of FIG. 3B is covered by a reflective metal coating 15, such that the oblique surface 3A causes a reflection of the optical beam emitted from the edge surface 13A of the optical waveguide 13 and entered into the device substrate 3 at the vertical side wall, toward the diffusion region 7b. It is also possible to cause the desired deflection of the optical beam by the total reflection at the foregoing oblique surface 3A. It should be noted that the photoreception device 204 is mounted on the support substrate 1 by soldering the foregoing metal coating 15 covering the lower major surface of the device substrate 3 on the top surface of the support substrate 1.

In any of the foregoing conventional optical module structures of FIGS. 3A and 3B, the sub-mount 2 or 14 used in the previously described prior art is eliminated, and the number of the parts forming the module is reduced substantially. Further, the optical module structures of FIG. 3A or 3B, in which the photoreception device is mounted directly on the support substrate 1, allows an exact positioning of the photoreception device 203 or 204 on the support substrate 1 by merely using a marker M. Thus, the optical module 103 or 104 is easy for assembling, and the cost of the device is reduced substantially.

It should be noted that the construction of FIG. 2 as well as the constructions of FIGS. 3A and 3B are disclosed in the Japanese Laid-open Patent Publication 8-316506 corresponding to the U.S. patent application Ser. No. 08/552,474 filed Nov. 9, 1995, which is incorporated herein as reference. It should be noted that the foregoing Japanese Laid-open Patent Publication 8-316506 was laid-open on Nov. 29, 1996.

On the other hand, there is a further room for improvement in the optical modules 103 and 104 of FIGS. 3A and 3B with regard to size, integration density, easiness of assembling and cost.

SUMMARY OF THE INVENTION

Accordingly, it is a general object of the present invention to provide a novel and useful photoreception device, an optical module including such a photoreception device, and further an optical unit including such an optical module, wherein the foregoing problems are eliminated.

Another and more specific object of the present invention is to provide a photoreception device, comprising:

a device substrate having a first principal surface and a second principal surface;

a photodetection region formed at a side of said first principal surface of said device substrate, said photodetection region including a diffusion region formed in the vicinity of said first principal surface, said diffusion region thereby forming a junction;

an oblique surface formed on a part of said device substrate with an oblique angle with respect to said second principal surface, such that said oblique surface causes a deflection of an optical beam incident thereto to said photodetection region;

a first electrode provided on said first principal surface of said device substrate in correspondence to said photodetection region in contact with said diffusion region; and a second electrode provided at a side of said second principal surface of said device substrate for reversely biasing said junction of said photodetection region.

According to the present invention, it is possible to form the second electrode on the second principal surface of the device substrate, which faces the support substrate, with a large area as desired. As a result, a large current can be supplied to the photodetection region, while simultaneously minimizing the total size of the device substrate and hence the size, particularly the length, of the photoreception device. Further, the photoreception device of the present invention includes one photodetection region for each channel in the form of a junction formed at the foregoing first principal surface, and the fabrication of the photoreception device of the present invention is substantially facilitated. Further, the photoreception device of the present invention is suitable for the formation of the photodetection regions with a large number on the first principal surface of the device substrate, with high integration density. In other words, the present invention facilitates the improvement of the integration density of the optical module. In addition, the photoreception device of the present invention can be mounted on a support substrate by using the second electrode not only for the mechanical mounting purposes but also for the electrical wiring purposes. When mounting the photoreception device on a support substrate, it should be noted that any mechanical strain that is applied to the photoreception device acts primarily on the device substrate that contacts directly with the support substrate, and the photodetection region is kept substantially free from a strain. Thereby, the dark current of the photoreception device is reduced substantially.

Another object of the present invention is to provide a photoreception device, comprising:

a device substrate having a principal surface;

a photodetection region formed at a side of said principal surface of said device substrate, said photodetection region including a diffusion region formed in the vicinity of said principal surface, said diffusion region thereby forming a junction;

an oblique surface formed on a part of said device substrate with an oblique angle with respect to said principal surface, such that said oblique surface causes a deflection of an optical beam incident thereto to said photodetection region;

a first electrode provided at said side of said principal surface of said device substrate in correspondence to said photodetection region in contact with said diffusion region; and a second electrode provided at said side of said principal surface of said device substrate in electrical contact therewith, for reversely biasing said junction of said photodetection region, said second electrode covering substantially a remaining area of said principal surface.

According to the present invention, the diffusion region formed conventionally in the device substrate in correspondence to the second electrode is eliminated by providing the second electrode in direct contact with the device substrate, and the fabrication of the photoreception device is facilitated substantially. Further, the construction of the photoreception device of the present invention is advantageous when conducting a face-down flip-chip bonding process in which the first and second electrodes are connected mechanically and simultaneously electrically with corresponding patterns on a support substrate.

Another object of the present invention is to provide an optical module, comprising:

a support substrate; and a photoreception device provided on said support substrate, said photoreception device comprising: a device substrate having a first principal surface and a second principal surface; a photodetection region formed at a side of said first principal surface of said device substrate, said photodetection region including a diffusion region formed in the vicinity of said first principal surface, said diffusion region thereby forming a junction; an oblique surface formed on a part of said device substrate with an oblique angle with respect to said second principal surface, such that said oblique surface causes a deflection of an optical beam incident thereto to said photodetection region; a first electrode provided at a side of said first principal surface of said device substrate in correspondence to said photodetection region in contact with said diffusion region; and a second electrode provided at a side of said second principal surface of said device substrate for reversely biasing said junction of said photodetection region;

wherein said photoreception device is mounted upon said support substrate by connecting either one of said first and second electrodes upon said support substrate.

Another object of the present invention is to provide an optical module, comprising:

a support substrate; and a photoreception device provided on said support substrate, said photoreception device comprising: a device substrate having a principal surface; a photodetection region formed at a side of said principal surface of said device substrate, said photodetection region including a diffusion region formed in the vicinity of said principal surface, said diffusion region thereby forming a junction; an oblique surface formed on a part of said device substrate with an oblique angle with respect to said principal surface, such that said oblique surface causes a deflection of an optical beam incident thereto to said photodetection region; a first electrode provided at said side of said principal surface of said device substrate in correspondence to said photodetection region in contact with said diffusion region; and a second electrode provided at said side of said principal surface of said device substrate in electrical contact therewith, for reversely biasing said junction of said photodetection region, said second electrode covering substantially a remaining area of said principal surface.

wherein said photoreception device is mounted upon said support substrate by connecting said first and second electrodes upon said support substrate.

Another object of the present invention is to provide an optical module, comprising:

a support substrate; and a photoreception device provided on said support substrate, said photoreception device comprising: a device substrate having a first principal surface and a second principal surface; a photodetection region formed at a side of said first principal surface of said device substrate, said photodetection region including a diffusion region formed in the vicinity of said principal surface, said diffusion region thereby forming a junction; an oblique surface formed on a part of said device substrate with an oblique angle with respect to said principal surface, such that said oblique surface causes a deflection of an optical beam incident thereto to said photodetection region; a first electrode provided at said side of said first principal surface of said device substrate in correspondence to said photodetection region in contact with said diffusion region; and a second electrode provided at said side of said first principal surface of said device substrate in electrical contact therewith, for reversely biasing said junction of said photodetection region, said second electrode covering substantially a remaining area of said principal surface.

wherein said photoreception device is mounted upon said support substrate by a bonding medium provided on said second principal surface of said device substrate.

Another object of the present invention is to provide an optical module, comprising:

a support substrate; and a photoreception device provided on said support substrate, said photoreception device comprising: a device substrate having a first principal surface and a second principal surface; a photodetection region formed at a side of said first principal surface of said device substrate, said photodetection region including a diffusion region formed in the vicinity of said first principal surface, said diffusion region thereby forming a junction; and an oblique surface formed on a part of said device substrate with an oblique angle with respect to said second principal surface, such that said oblique surface causes a deflection of an optical beam incident thereto to said photodetection region;

said device substrate having a flat side wall extending vertically to a principal surface of said support substrate in a state in which said photoreception device is mounted upon said support substrate;

said support substrate carrying on said principal surface thereof a marker in alignment with said flat side wall of said device substrate.

Another object of the present invention is to provide an optical module, comprising:

a support substrate carrying a projection; and a photoreception device provided on said support substrate, said photoreception device comprising: a device substrate having a first principal surface and a second principal surface; a photodetection region formed at a side of said first principal surface of said device substrate, said photodetection region including a diffusion region formed in the vicinity of said first principal surface, said diffusion region thereby forming a junction; and an oblique surface formed on a part of said device substrate with an oblique angle with respect to said second principal surface, such that said oblique surface causes a deflection of an optical beam incident thereto to said photodetection region;

said device substrate having a depression on said second principal surface thereof;

said support substrate carrying said photoreception device thereon in such a state that said projection on said support substrate is in engagement with said depression of said device substrate.

Another object of the present invention is to provide an optical module, comprising:

a support substrate; and a photoreception device provided on said support substrate, said photoreception device comprising: a device substrate having a first principal surface and a second principal surface; a photodetection region formed at a side of said first principal surface of said device substrate, said photodetection region including a diffusion region formed in the vicinity of said first principal surface, said diffusion region thereby forming a junction; and an oblique surface formed on a part of said device substrate with an oblique angle with respect to said second principal surface, such that said oblique surface causes a deflection of an optical beam incident thereto to said photodetection region;

said device substrate having a flat side wall extending vertically to a principal surface of said support substrate in a state in which said photoreception device is mounted upon said support substrate;

said support substrate carrying on said principal surface thereof a projection in engagement with said flat side wall of said device substrate.

Another object of the present invention is to provide an optical module, comprising:

a support substrate;

an optical waveguide provided on said support substrate; and a photoreception device provided on said support substrate, said photoreception device comprising: a device substrate having a first principal surface and a second principal surface; a photodetection region formed at a side of said first principal surface of said device substrate, said photodetection region including a diffusion region formed in the vicinity of said first principal surface, said diffusion region thereby forming a junction; and an oblique surface formed on a part of said device substrate with an oblique angle with respect to said second principal surface, such that said oblique surface causes a deflection of an optical beam incident thereto to said photodetection region;

said device substrate having a flat side wall extending vertically to a principal surface of said support substrate in a state in which said photoreception device is mounted upon said support substrate;

said support substrate carrying said optical waveguide thereon such that an edge surface of said optical waveguide engages with said flat side wall of said device substrate.

Another object of the present invention is to provide an optical module, comprising:

a support substrate;

an optical waveguide structure provided on said support substrate for guiding an optical signal therethrough;

a photoreception device provided on said support substrate, said photoreception device comprising: a device substrate having a first principal surface and a second principal surface; a photodetection region formed at a side of said first principal surface of said device substrate, said photodetection region including a diffusion region formed in the vicinity of said first principal surface, said diffusion region thereby forming a junction; and an oblique surface formed on a part of said device substrate with an oblique angle with respect to said second principal surface, such that said oblique surface causes a deflection of an optical beam incident thereto to said photodetection region; and a light emitting device provided on said support substrate;

said photoreception device and said light emitting device being disposed in an optical alignment with said optical waveguide structure such that an optical beam emitted from said optical waveguide structure impinges upon said oblique surface of said photoreception device and such that an optical beam emitted from said light emitting device enters said optical waveguide structure;

said photoreception device and said light emitting device being so disposed that an optical beam emitted from said light emitting device further impinges upon said oblique surface of said photoreception device.

According to the optical module of the present invention, the photoreception device can be mounted on the support substrate in an optical coupling with other optical devices that are mounted on the same support substrate in a similar flip-chip process. For example, the photoreception device can be mounted adjacent to an edge-emission type laser diode flip-chip mounted also on the support substrate. In other words, the photoreception device of the present invention is suitable for forming an optical module that includes various optical devices in addition to the photoreception device on the same support substrate. Thereby, it becomes possible to drive a light emitting device while monitoring an output optical power thereof by the photoreception device. By providing a marker or a similar structure on the support substrate, it is possible to achieve a proper optical alignment between the photoreception device and the optical waveguide or other optical device on the support substrate easily. As the photoreception device engages directly with the support substrate in the optical module of the present invention, there is no degree of freedom in the positioning of the photoreception device in the direction vertical to the principal surface of the support substrate. Thus, the optical alignment is made only within the plane of the foregoing principal surface. The use of the marker structure further reduces the degree of freedom. Further, the edge surface of the optical waveguide itself can be used for the purpose of such a marker structure.

Another object of the present invention is to provide an optical module, comprising:

a support substrate; and a photoreception device provided on said support substrate, said photoreception device comprising: a device substrate having a first principal surface and a second principal surface; a photodetection region formed at a side of said first principal surface of said device substrate, said photodetection region including a diffusion region formed in the vicinity of said first principal surface, said diffusion region thereby forming a junction; and an oblique surface formed on a part of said device substrate with an oblique angle with respect to said second principal surface, such that said oblique surface causes a deflection of an optical beam incident thereto to said photodetection region;

said device substrate carrying, on said second principal surface, a vent structure communication with a side wall different from the part of said device substrate where said oblique surface is formed, for escaping a medium used for bonding said device substrate on said support substrate.

According to the present invention, the problem of the oblique surface, to which the incident optical beam impinges, is contaminated by a medium such as an adhesive or a molten solder used for bonding the device substrate on the support substrate, is effectively eliminated, and the assembling of the optical module becomes substantially facilitated. Thereby, the throughput of production and the cost of the optical module are reduced substantially. Further, the optical module thus formed has an improved reliability.

Another object of the present invention is to provide an optical unit, comprising:

a package substrate;

an optical waveguide provided on said package substrate, said optical waveguide having a first edge surface and a second opposing edge surface;

a photoreception device provided on said package substrate, said photoreception device comprising: a device substrate having a first principal surface and a second principal surface; a photodetection region formed at a side of said first principal surface of said device substrate, said photodetection region including a diffusion region formed in the vicinity of said first principal surface, said diffusion region thereby forming a junction; and an oblique surface formed on a part of said device substrate with an oblique angle with respect to said second principal surface, such that said oblique surface causes a deflection of an optical beam incident thereto to said photodetection region;

said photoreception device being disposed on said package substrate such that said oblique surface of said device substrate establishes an optical coupling with said first edge surface of said optical waveguide;

a first optical fiber having first and second edge surfaces, said first optical fiber being disposed on said package substrate such that said first edge surface of said first optical fiber establishes an optical coupling with said second edge surface of said optical waveguide, said first optical fiber having an exposed outer surface;

a second optical fiber having first and second edge surfaces respectively at first and second ends;

a holder holding said second end of said first optical fiber and said first end of said second optical fiber, said holder being disposed on said package substrate such that said first edge surface of said second optical fiber established an optical coupling with said second edge surface of said first optical fiber; and an optical coupler provided on said second end of said second optical fiber.

According to the present invention, it is possible to solder the first optical fiber on the package substrate in alignment with the photoreception device, by providing the first optical fiber without a resin sheath.

Another object of the present invention is to provide an optical unit, comprising:

a package substrate;

an optical waveguide provided on said package substrate, said optical waveguide having a first edge surface and a second opposing edge surface;

a photoreception device provided on said package substrate, said photoreception device comprising: a device substrate having a first principal surface and a second principal surface; a photodetection region formed at a side of said first principal surface of said device substrate, said photodetection region including a diffusion region formed in the vicinity of said first principal surface, said diffusion region thereby forming a junction; and an oblique surface formed on a part of said device substrate with an oblique angle with respect to said second principal surface, such that said oblique surface causes a deflection of an optical beam incident thereto to said photodetection region;

said photoreception device being disposed on said package substrate such that said oblique surface of said device substrate establishes an optical coupling with said first edge surface of said optical waveguide;

an optical fiber having first and second edge surfaces, said optical fiber being disposed on said package substrate such that said first edge surface of said optical fiber establishes an optical coupling with said second edge surface of said optical waveguide, said optical fiber having an exposed outer surface; and a ferrule holding said second end of said optical fiber, said ferrule having an end surface exposing said second end of said optical fiber in a flash relationship.

According to the present invention, an excellent optical coupling is achieved between the foregoing optical fiber and an external optical fiber by merely engaging the ferrule at the second end of the optical fiber with a corresponding ferrule of the external optical fiber. Further, the optical unit of the present invention, lacking the pigtail optical connector, is structurally simple and is produced easily.

Another object of the present invention is to provide an optical unit, comprising:

a package substrate;

an optical waveguide provided on said package substrate, said optical waveguide having a first edge surface and a second opposing edge surface;

a photoreception device provided on said package substrate, said photoreception device comprising: a device substrate having a first principal surface and a second principal surface; a photodetection region formed at a side of said first principal surface of said device substrate, said photodetection region including a diffusion region formed in the vicinity of said first principal surface, said diffusion region thereby forming a junction; and an oblique surface formed on a part of said device substrate with an oblique angle with respect to said second principal surface, such that said oblique surface causes a deflection of an optical beam incident thereto to said photodetection region;

said photoreception device being disposed on said package substrate such that said oblique surface of said device substrate establishes an optical coupling with said first edge surface of said optical waveguide;

an optical fiber held on said package substrate, said optical fiber having an end establishing an optical coupling with said second edge surface of said optical waveguide; and a lid member provided on said package substrate so as to cover said optical waveguide including said photoreception device, said optical waveguide and said end of said optical fiber, said lid member and said package substrate forming a hermetic seal.

According to the present invention, the assembling of the optical unit can be achieved easily. Further, the optical unit of the present invention has a solid construction.

Other objects and further features of the present invention will become apparent from the following detailed description when read in conjunction with the attached drawings.

BRIEF DESCRIPTION OF THE DRAWINGS

FIG. 2 is a diagram showing the construction of another conventional optical module;

FIGS. 33A–30E are diagrams showing various modifications of an optical module according to a twenty-ninth embodiment of the present invention;

FIGS. 37A–37H are diagrams showing the assembling processes of an optical unit according to a thirty-third embodiment of the present invention;

DETAILED DESCRIPTION OF THE PREFERRED EMBODIMENTS

[GENERAL SUMMARY]

First, a brief summary will be made about the photoreception device used in the optical module of the present invention.

As will be explained in detail later, the photoreception device is of the type that includes: a device substrate having a first principal surface and a second principal surface; a photodetection region formed on the first principal surface of the device substrate, the photodetection region including a diffusion region formed in the vicinity of the first principal surface, the diffusion region thereby forming a junction at an interface to the device substrate; an oblique surface formed on a part of the device substrate with an oblique angle with respect to the second principal surface, such that the oblique surface causes a deflection of an optical beam incident thereto to the photodetection region; a first electrode provided on the first principal surface of the device substrate in correspondence to the photodetection region in contact with the diffusion region; and a second electrode provided on the second principal surface of the device substrate for reversely biasing the junction of the photodetection region.

The foregoing photoreception device used in the present invention is particularly suitable for mounting on a support substrate by a flip-chip process at either the first or second electrode. Thereby, a mechanical connection and an electrical connection are achieved simultaneously, and the production of the optical module is substantially facilitated.

[FIRST EMBODIMENT]

Figure 4A:
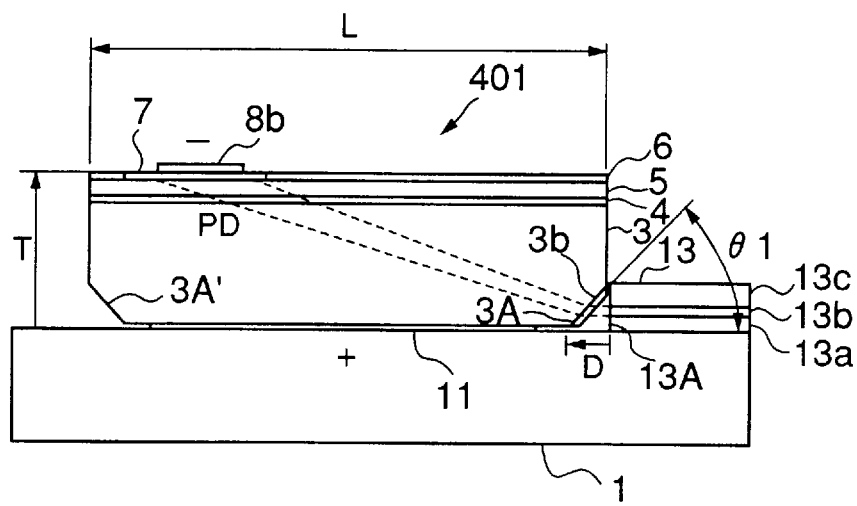
FIGS. 4A and 4B are diagrams showing the construction of an optical module according to a first embodiment of the present invention and the equivalent circuit diagram thereof.
Figure 4B:
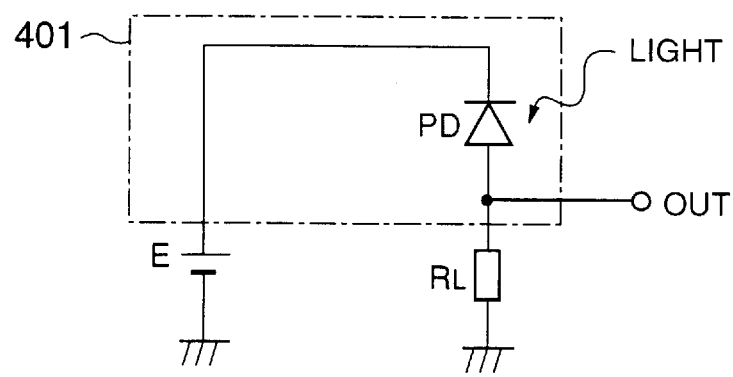
Figure 5A:
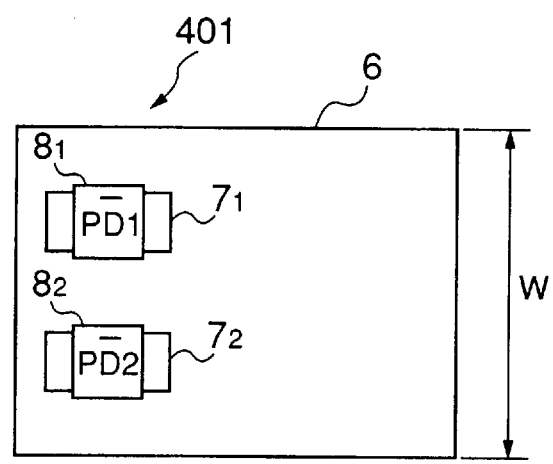
FIGS. 5A and 5B are diagrams showing the optical module of the first embodiment respectively in a plan view and a bottom view.
Figure 5B:
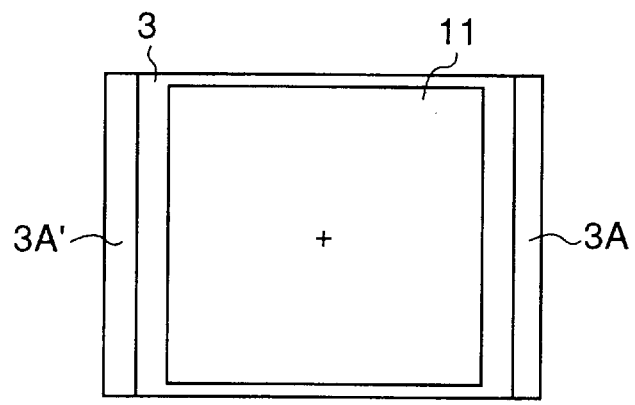

FIGS. 4A and 4B as well as FIGS. 5A and 5B show the construction of an optical module 301 according to a first embodiment of the present invention, wherein FIG. 4A shows the optical module 301 in a cross-sectional view. In the drawings, those parts corresponding to the parts described previously are designated by the same reference numerals and the description thereof will be omitted.

Referring to FIG. 4A, the optical module 301 includes the optical waveguide 13 on the support substrate 1 and further a photoreception device 401 such that the photoreception device 401 is mounted directly on the support substrate. It should be noted that the photoreception device is formed with the oblique surface 3A with an angle $\Theta_1$ with respect to the principal surface of the support substrate 1 such that the oblique surface 3A forms a chamfered edge structure.

The optical waveguide 13 is formed by glass or semiconductor layers deposited on the support substrate 1, which may be formed of Si, by a deposition process such as a CVD process. The optical waveguide 13 thus formed includes a layered structure, in which a core layer 13b having a refractive index $n_1$ is sandwiched vertically or laterally by cladding layers 13a and 13c each having a refractive index $n_2$ that is smaller than the refractive index $n_1$ ($n_2 < n_1$). For the support substrate 1, it is also possible to use a semiconductor crystal substrate other than Si such as InP or even an amorphous substrate such as a glass slab.

On the other hand, the photoreception device 401 includes, similarly to the photoreception device 203, the device substrate 3 of n-type InP that carries thereon the buffer layer 4 of $n^+$-type InP and the optical absorption layer 5 of undoped InGaAs, wherein the buffer layer 4 and the optical absorption layer 5 are formed consecutively on the device substrate 3 by a planar process. On the optical absorption layer 5, the layer 6 of $n^-$-type InP is formed similarly to the device 203, and the InP layer 6 thus formed is further formed with one or more of p-type InP region 7 in a part thereof as a result of diffusion of Zn into the layer 6.

The fabrication of the photoreception device 401 may be carried out by depositing the layers 4–6 consecutively on the support substrate 3, followed by the formation of the p-type diffusion regions 7 in the layer 6 of n⁻-type InP thus formed, wherein the diffusion regions 7 are formed with a generally equal interval L. Further, the device substrate 3 is subjected to a chemical etching process to form a plurality of V-shaped grooves on the device substrate 3 at the side opposite to the side where the diffusion regions 7 are formed. The V-shaped grooves are formed uniformly with the interval L in correspondence to the diffusion regions 7. By cleaving the device substrate 3 thus formed with the V-shaped grooves into individual chips, the foregoing chamfer structure is formed so as to surround each of the chips by the foregoing oblique surfaces 3A.

It should be noted that the angle $\Theta_1$ of the oblique surface 3A thus formed is determined by various factors such as the etchant applied to the device substrate 3, the type of the etching mask such as $SiO_2$ or SiN or photoresist formed on the device substrate 3, the crystal orientation of the device substrate 3, and the like. When a (100)-oriented substrate of InP is used for the device substrate 3, as is practiced commonly in the art, the angle $\Theta_1$ takes a value of about 55°. The present invention, however, is by no means limited to such a particular setting of the angle $\Theta_1$, and thus, the angle $\Theta_1$ may be set arbitrarily in the range between 35°–55°. As the device substrate 3 of InP is substantially transparent to optical radiation having a wavelength of 1.3–1.6 μm, the oblique surface 3A thus formed acts as a refraction surface. It should be noted that the transmittance of the optical beam of the foregoing wavelength range through an InP crystal exceeds 95%.

Further, the photoreception device 401 of FIG. 4A includes an anti-reflection coating 3b on the surface of the refraction surface 3A for eliminating a reflection at a gap formed between the refraction surface 3A and the opposing edge surface 13A of the optical waveguide 13. The oblique surface 3A may be formed uniformly over the entire width of the device substrate 3 forming a chip, or alternatively on a selected part thereof, depending upon the design requirement. This applied also to other embodiments to be described later.

After the diffusion region 7 is thus formed, the p-type electrode 8 is formed on the diffusion region 7 with a layered structure including the stacking of an AuZn alloy layer and an Au layer as usual. Further, another, n-type electrode 11 is formed on the rear side of the device substrate 3 by stacking an AuGe alloy layer and an Au layer. Each of the electrodes 8 and 11 established an ohmic contact with the corresponding semiconductor layer after a thermal annealing process.

As noted already, the layered structure thus obtained on the device substrate 3 with a number of the diffusion regions 7 and the V-shaped grooves, is cleaved at the foregoing V-shaped grooves into individual chips each having a size equal to the interval L. Thereby, the fabrication of the photoreception device is facilitated substantially.

It should be noted that each of the photoreception device 401 thus formed has a size determined in view of the angle $\Theta_1$ of the oblique surface 3A and the electrode area, particularly of the n-type electrode 11. In a typical example, the size L of the chip is set to about 650 μm. Further, each chip may have a total thickness T of about 150 μm. By forming the photoreception device 401 as such, it is possible to form the distance D between the edge surface 13A of the optical waveguide 13 and the oblique surface 3A, to be relatively small. As a result, the divergence of the optical beam emitted from the waveguide edge surface 13A is minimized, and the vertical size of the oblique surface 3A or the depth of the V-shaped groove can be reduced to about 15 μm.

The photoreception device 401 thus formed is suitable for flip-chip mounting on the support substrate 1 by forming a solder bump of Sn or AuSn on the n-type electrode 11. Thus, by merely mounting the photoreception device 401 on the support substrate 1 such that the solder bump on the electrode 11 engages with a corresponding wiring pattern on the support substrate 1, which may be formed by a deposition of Au and the like, and further by conducting an annealing process at about 300° C. for causing a reflow of the solder bump, it is possible to connect the photoreception device 401 on the support substrate 1 mechanically as well as electrically. Further, an electrical contact is achieved on the p-type electrode 8 by way of a wire bonding process.

In the foregoing flip-chip mounting process of the photoreception device 401, substantially all the stresses occurring at the time of the mounting are applied to the device substrate 3, and the junction region 7 is kept substantially free from stresses. As a result, the dark current of the photodetection is reduced substantially. It should be noted that the n-type electrode 11 is connected to a positive side of a dc voltage source while the p-type electrode 8 is connected to a load.

FIG. 4B shows the equivalent circuit diagram of the photoreception device 401.

Referring to FIG. 4B, it should be noted that the foregoing p-type InP region 7 forms, together with the optical absorption layer 5 of undoped InGaAs and the buffer layer 4 of n-type InP, a pin diode. The pin diode thus formed is reversely biased and functions as a photodiode PD. Thus, the optical beam emitted from the edge surface 13A of the optical waveguide 13 is refracted by the foregoing refraction surface 3A and reaches a part of the optical absorption layer 5 where the photodiode PD is formed with an appropriate slight beam divergence. In response to the incoming of the optical beam to the optical absorption layer 5, an excitation of electron-hole pairs occurs in the optical absorption layer 5 efficiently. The electrons and holes thus excited are then drifted in mutually opposite directions according to the electrode formed between the foregoing electrodes 11 and 8. In other words, the photodiode PD conducts in response to the optical beam from the optical waveguide 13.

FIGS. 5A and 5B show the photoreception device 401 respectively in a plan view and a rear view.

Referring to FIG. 5A, it should be noted that the photoreception device 401 includes two photodiodes PD1 and PD2 in correspondence to two optical channels. The photoreception device 401 itself may have a width W of about 600 μm, while each of the p-type diffusion regions $7_1$ and $7_2$ corresponding to the diffusion region 7 of FIG. 4A, has a very small area of 60 μm×150 μm due to a small diameter ø of about 40 μm. Thus, each of the photodiodes PD1 and PD2 provides a very fast response when detecting an incoming optical beam. As the photoreception device 401 includes no diffusion regions other than the diffusion regions 7a and 7b at the top side thereof, it is possible to design the diffusion regions 7a and 7b in any arbitrary shape and size.

Referring to FIG. 5B, it should be noted that, in the photoreception device 401, it is possible to form the n-type electrode 11 on the bottom side of the device substrate 403 with a large size and area. Typically, the n-type electrode 11 can have an area more than ten-times the area of the p-type diffusion region 7. With this, it is possible to supply a large drive current to the photodiode. As the electrode 11 is formed only on the bottom side of the device substrate 3, it is possible to form the electrode 11 with an arbitrary shape and size.

[SECOND EMBODIMENT]

Figure 6:
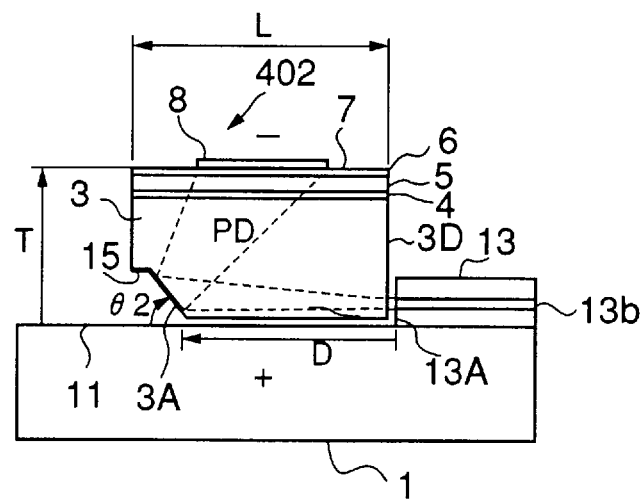
FIG. 6 is a diagram showing the construction of an optical module according to a second embodiment of the present invention.

FIG. 6 shows the cross-section of an optical module 302 according to a second embodiment of the present invention, wherein those parts corresponding to the parts described previously are designated by the same reference numerals and the description thereof will be omitted.

Referring to FIG. 6, the optical module 302 includes a photoreception device 402 on the support substrate 1 similarly to the optical module 301 of FIG. 4A, except that the photoreception device 402 includes a vertical reception surface 3D at a side wall of the device substrate 3 so as to face the edge surface 13A of the optical waveguide 13. Further, the photoreception device 402 includes the oblique surface 3A at a side wall opposing the foregoing reception surface 3D with an angle $\Theta_2$ with respect to the substrate surface of the support substrate 1. Thereby, the oblique surface 3A forms a chamfered structure. The oblique surface 3A is covered by a reflective coating similar to the metal coating 15 used in the photoreception device of FIG. 3B, and causes a reflection of the optical beam emitted from the foregoing edge surface 13A of the optical waveguide 13 and entered into the device substrate 3 at the reception surface 3D. Alternatively, the reflection of the optical beam may be caused by the total reflection at the oblique surface 3A.

In the optical module 302 of FIG. 6, it should be noted that the optical beam emitted from the edge surface 13A of the optical waveguide 13 reaches the part of the optical absorption layer 5 where the photodiode PD is formed, with an appropriate beam divergence. As the optical beam is reflected back by the oblique surface 3A, the construction of FIG. 6 is suitable for reducing the length of the photoreception device 402 to about one-half the length L of the photoreception device 401 of FIG. 4A. Even when the size L of the photoreception device 402 is reduced as such, it is possible to secure a sufficiently large area for the n-type electrode 11 at the bottom side of the device substrate 3. Thus, the construction of FIG. 6 is advantageous for providing a compact optical module that operates at a high speed with very little dark current.

When there is a gap between the edge surface 13A of the optical waveguide 13 and the reception surface 3D in the optical module 302 of FIG. 6, it is preferable to apply an anti-reflection coating (not shown) to the foregoing reception surface 3D. In order to suppress the optical scattering at the reception surface 3D as much as possible, it is preferable to form the reception surface 3D by a cleaving process in the optical module 302 such that the reception surface 3D has an excellent flatness. As the distance D between the edge surface 13A of the optical waveguide 13 and the oblique surface 13A is increased in the present embodiment as compared with the embodiment of FIG. 4A, the divergence of the optical beam emitted from the edge surface 13A of the optical waveguide 13 and reaching the oblique surface 3A is enhanced. Thus, the oblique surface 3A is formed to have an increased height of about 70 $\mu$m in the embodiment of FIG. 6, by forming the V-shaped groove with a depth of about 70 $\mu$m. The angle $\Theta_2$, on the other hand, is typically set to about 55°. However, the angle $\Theta_2$ is by no means limited to this particular value but may be set to fall anywhere in the range between 35°–55°.

[THIRD EMBODIMENT]

Figure 7:
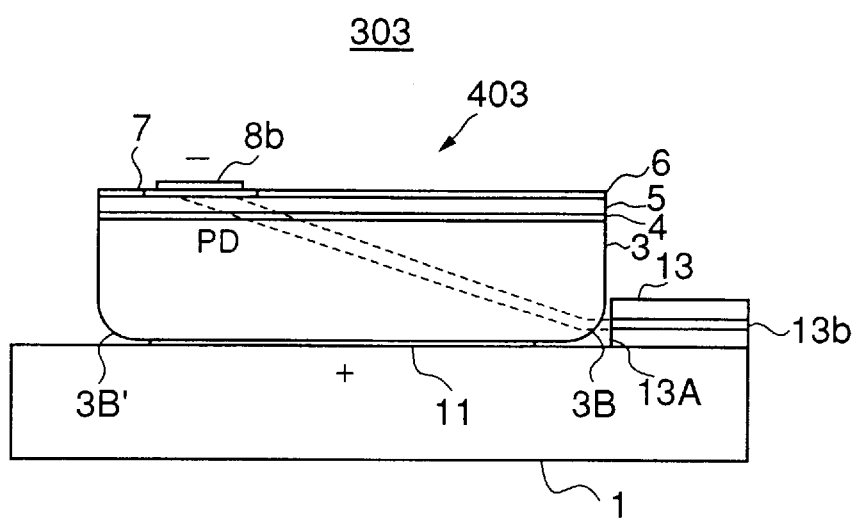
FIG. 7 is a diagram showing the construction of an optical module according to a third embodiment of the present invention.

FIG. 7 shows the construction of an optical module 303 according to a third embodiment of the present invention, wherein those parts described previously are designated by the same reference numerals and the description thereof will be omitted.

Referring to FIG. 7, which uses a photoreception device 403 in place of the photoreception device 401 or 402 used in the previous embodiment, it will be noted that the photoreception device 403 has a construction substantially identical to that of the photoreception device 401 except that the photoreception device 403 includes a curved refractive surface 3B at the bottom edge of the device substrate 3 in place of the flat oblique surface 3A, such that the optical beam refracted by the refractive surface is focused upon the photodiode PD.

The formation of the curved surface 3B is generally difficult by a conventional chemical etching process. Thus, the present invention forms such a curved surface 3B by first forming a flat chamfered surface similar to the oblique surface 3A on the device substrate 3, forming a photoresist pattern on the flat chamfered surface, causing a deformation of the photoresist pattern surface generally in conformity with the desired curved shape of the oblique surface 3B, and applying an etching process to the device substrate 3 together with the photoresist pattern, Thereby, the deformed shape of the resist pattern is transferred to the foregoing curved surface 3B. The correspondence between the shape of the resist and the shape of the curved surface 3B depends upon the selectivity ratio of the etching process between the resist and the device substrate 3. Thus, the etching is carried out under an optimized condition such that the desired shape is obtained for the curved surface 3B in view of the shape of the photoresist pattern.

In the optical module 303 of FIG. 7, the optical beam from the edge surface 13A of the optical waveguide 13 is focused by the curvature of the refractive surface 3B as noted already, to a part of the optical absorption layer 5 where the photodiode PD is formed. As a result of such focusing of the optical beam at the photodiode PD, it is possible to reduce the area of the junction region 7 in the optical module 303 substantially. Thereby, the photoreception device 403 can operate with a bit rate of as high as 10 Gbps.

In the embodiment of FIG. 7, it should be noted that the curved surface 3B may be formed to have a form of a convex lens.

[FOURTH EMBODIMENT]

Figure 8:
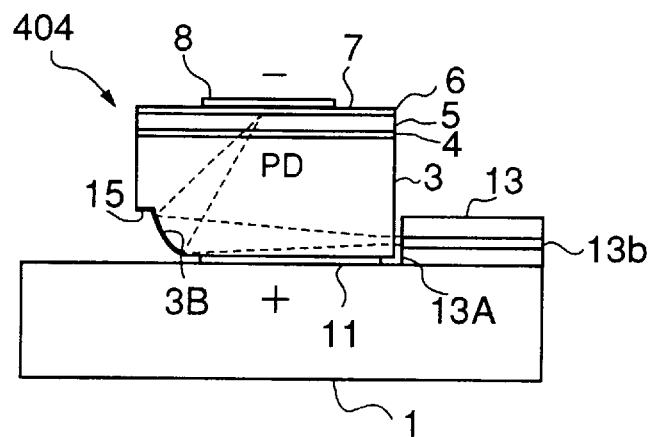
FIG. 8 is a diagram showing the construction of an optical module according to a fourth embodiment of the present invention.

FIG. 8 shows the construction of an optical module 304 according to a fourth embodiment of the present invention in a cross-sectional view, wherein those parts described previously are designated by the same reference numerals and the description thereof will be omitted.

Referring to FIG. 8, the optical module 304 has a construction somewhat similar to that of the optical module 302 in that the optical beam emitted from the edge surface 13A of the optical waveguide 13 is directed to the photodiode PD after a reflection at a reflection surface, wherein the photoreception device 302 used in the embodiment of FIG. 6 is replaced with a photoreception device 304.

The photoreception device 304 has a construction similar to that of the photoreception device 302, except that the flat reflection surface 3A is now replaced with the curved surface 3B that causes a focusing of an optical beam incident thereto as it is reflected by the curved surface 3B.

Thus, in the optical module 304 of FIG. 7, the optical beam emitted from the edge surface 13A of the optical waveguide 13 is focused, after a reflection by the reflection surface 3B, upon a part of the optical absorption layer 5 where the photodiode PD is formed. As a result of the focusing of the optical beam, it is possible to reduce the area of the junction forming the photodiode PD similarly to the embodiment of FIG. 7. Thereby, the photoreception device 404 5 operates in the optical module 304 at a high speed. In addition, the optical module 304 has an advantageous feature of reduced size similarly to the optical module 302 of FIG. 6. It should be noted that it is also possible to form the curved surface 3B to form a convex surface.

[FIFTH EMBODIMENT]

Figure 9:
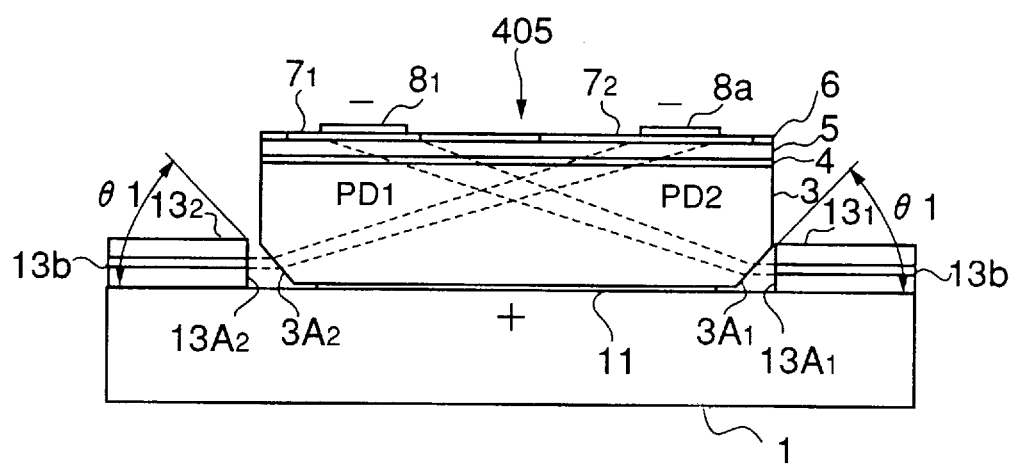
FIG. 9 is a diagram showing the construction of an optical module according to a fifth embodiment of the present invention.

FIG. 9 shows an optical module 305 according to a fifth embodiment of the present invention in a cross-sectional view.

Referring to FIG. 9, the optical module 305 includes a photoreception device 405 substantially identical to the photoreception device 401 of FIG. 4A on the support substrate 1, wherein the support substrate 1 carries thereon first and second optical waveguides $13_1$ and $13_2$ at respective sides of the photoreception device 405 such that the optical waveguides $13_1$ and $13_2$ oppose to each other across the photoreception device 405. Thereby, The optical waveguides $13_1$ and $13_2$ are disposed with an offset of the optical axis, and the photoreception device 405 is capable of detecting the two optical signals supplied from the respective optical waveguides $13_1$ and $13_2$ without interference. In order to detect the to optical beams, the photoreception device 405 includes two photodiodes PD1 and PD2.

While it is possible to receive two optical signals also in the optical module 301 of FIG. 4A, the optical module 305 of FIG. 9 is distinct in the point that the optical waveguides $13_1$ and $13_2$ are provided on the support substrate 1 at both lateral sizes of the photoreception device 405 so as to oppose with each other. By configuring the optical system as such, it is possible to utilize the optical module 305 efficiently.

While not illustrated, it should be noted that the optical module 305 can be configured such that the optical signals enter the photoreception device 405 not only in the lateral directions but also from the downward and upward directions with respect to the sheet of the illustration of FIG. 9. In this case, the optical module 305 can detect the optical beams incident to the photoreception device 406 from four or even five different directions.

[SIXTH EMBODIMENT]

Figure 10:
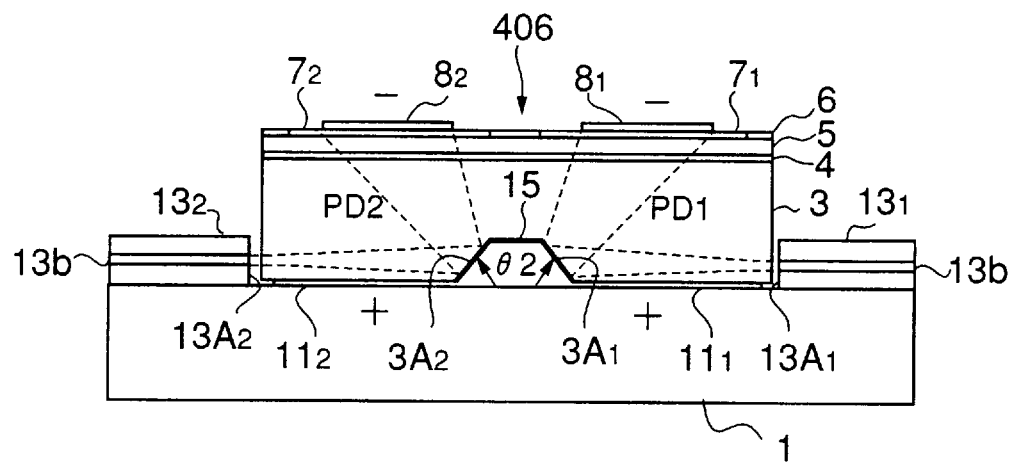
FIG. 10 is a diagram showing the construction of an optical module according to a sixth embodiment of the present invention.

FIG. 10 shows the cross-section of an optical module 306 according to a sixth embodiment of the present invention.

Referring to FIG. 10, the optical module 306 includes a photoreception device 406 on the support substrate 1 such that two of the photoreception device 402 of FIG. 6 are connected integrally in a mirror-symmetrical relationship at respective reflection surfaces $3A_1$ and $3A_2$ each corresponding to the foregoing oblique reflection surface 3A. Further, the optical waveguides $13_1$ and $13_2$ are provided monolithically on the support substrate 1 at both lateral sides of the photoreception device 406. Thus, the optical module 306 of FIG. 10 can detect two optical signals respectively supplied via the optical waveguides $13_1$ and $13_2$ with a reduced size. In the optical module 306 of FIG. 10, it should be noted that the optical beams emitted from respective edge surfaces $13A_1$ and $13_2$ of the optical waveguides 13A and 13B are reflected by reflection surfaces $3A_1$ and $3A_2$ respectively, wherein the optical beam thus reflected by the oblique surface $3A_1$ is directed to a photodiode $PD_1$ corresponding to the photodiode PD and the optical beam reflected by the oblique surface $3A_2$ is directed to a photodiode $PD_2$ also corresponding to the photodiode PD. As the two optical beams do not cause an interference in the optical module 306, it is possible to form the optical waveguides $13_1$ and $13_2$ on the support substrate 1 such that the respective optical axes are in a co-linear relationship. The photoreception device 406 and hence the optical module 306 has an advantageous feature of compact size particularly in the width direction perpendicular to the sheet of the drawing.

It should be noted that the photoreception device 406 includes two, mutually separated n-type electrodes $11_1$ and $11_2$ respectively corresponding to the n-type electrode 11, while it is possible to cause a short-circuit between the electrodes $11_1$ and $11_2$ by way of a conductor pattern (not illustrated) on the support substrate 1. The conductor pattern connecting the electrodes $11_1$ and $11_2$ on the support substrate 1 may be provided so as to avoid the central depression formed by the mirror surfaces $3A_1$ and $3A_2$.

[SEVENTH EMBODIMENT]

Figure 11:
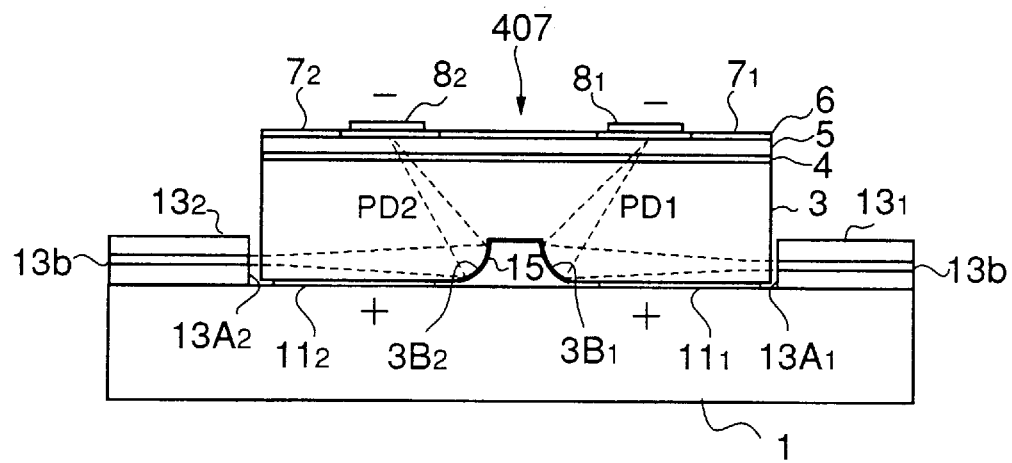
FIG. 11 is a diagram showing the construction of an optical module according to a seventh embodiment of the present invention.

FIG. 11 shows the construction of an optical module 307 according to a seventh embodiment of the present invention in a cross-sectional view.

Referring to FIG. 11, the optical module 307 includes a photoreception device 407 on the support substrate 1 such that two of the photoreception device 404 of FIG. 11 are connected integrally in a mirror-symmetrical relationship at respective reflection surfaces $3B_1$ and $3B_2$ each corresponding to the oblique surface 3B. Further, the optical waveguides $13_1$ and $13_2$ are provided on the support substrate 1 monolithically at both lateral sides of the photoreception device 407.

In the optical module 307, too, it is possible to receive the optical signals respectively emitted from the edge surfaces $13A_1$ and $13A_2$ in two opposing directions while reducing the size of the optical module. As the optical beams reflected by the foregoing oblique surfaces $3B_1$ and $3B_2$ experience a beam focusing as a result of the curvature of the oblique surfaces $3B_1$ and $3B_2$, it is possible to form the junction region of the photodiodes $PD_1$ and $PD_2$ with reduced area. Thereby, the optical module 307 is suitable for detecting high speed optical signals. Similarly to the embodiment of FIG. 10, the optical waveguides $13_1$ and $13_2$ may be disposed on the support substrate 1 such that the optical axes are in a co-linear relationship, as the optical beam emitted from the edge surface $13A_1$ and the optical beam emitted from the edge surface $13A_2$ are reflected respectively by the reflection surfaces $3B_1$ and $3B_2$ in mutually different directions. The photoreception device 407 and hence the optical module 307 has an advantageous feature of high speed operation in addition to the preferable feature of compact size in the width direction similarly to the embodiment of FIG. 11.

Hereinafter, embodiments of the optical module according to the present invention will be described for the case in which the optical waveguide 13 is provided above the supports substrate 1 with substantial distance, with reference to FIGS. 12–17. The embodiments to be described hereinafter are suitable not only for optical coupling with the waveguide provided on the support substrate 1 but also for optical coupling with an optical fiber of an arbitrary diameter.

[EIGHTH EMBODIMENT]

Figure 12:
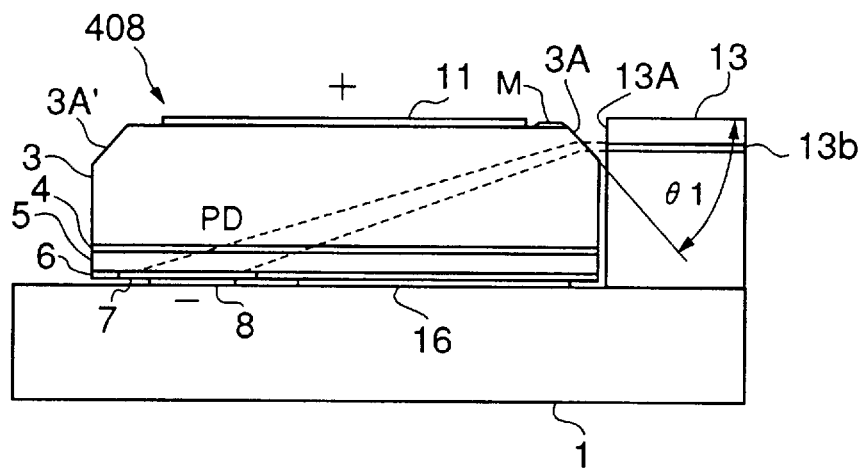
FIG. 12 is a diagram showing the construction of an optical module according to an eighth embodiment of the present invention.

FIG. 12 is a diagram showing the construction of an optical module 308 according to an eighth embodiment of the present invention in a cross-sectional view, wherein those parts corresponding to the parts described previously are designated by the same reference numerals and the description thereof will be omitted.

Referring to FIG. 12, the optical module 308 includes a photoreception device 408 on the support substrate 1 wherein the photoreception device 408 is substantially identical with the photoreception device 401 of FIG. 4A except that the device 408 is mounted upside down in a turned-over state or face-down state.

Thus, the p-type electrode 8 of the photoreception device 408 is formed with a solder bump for contacting with a corresponding pattern on the support substrate 1, and a wire-bonding process is applied to the exposed n-type electrode 11. As such a flip-chip mounting in the face-down state tends to induce an increase of the dark current due to the stress applied to the p-type electrode 8, it is preferable to provide a dummy bump structure on the InP layer 6 adjacent to the electrode 8 with a large area by means of a solder alloy or adhesive such that the stress at the time of mounting is distributed to such a bump structure.

It should be noted that the optical waveguide 13 is provided above the support substrate 1 by a distance corresponding to the thickness of the photoreception device 408. Thereby, the optical module 308 facilitates the recognition of the state of optical coupling between the edge surface 13A of the optical waveguide 13 and the refractive surface 3A. Thus, the optical module 308 is suitable for achieving an optical alignment process of the photoreception device 408 with respect to the optical waveguide 13 by way of an alignment marker M formed on the device 408.

[NINTH EMBODIMENT]

Figure 13:
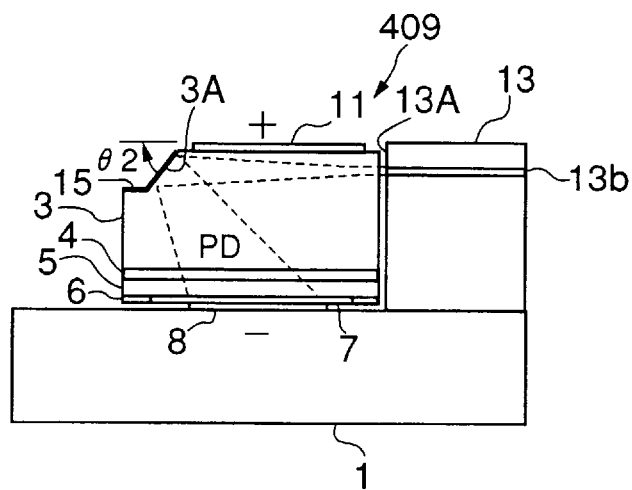
FIG. 13 is a diagram showing the construction of an optical module according to a ninth embodiment of the present invention.

FIG. 13 shows the construction of an optical module 309 according to a ninth embodiment of the present invention, wherein those parts corresponding to the parts described previously are designated by the same reference numerals and the description thereof will be omitted.

Referring to FIG. 13, the optical module 309 includes a photoreception device 409 on the support substrate 1, wherein the photoreception device 409 is substantially identical with the photoreception device 402 of FIG. 6 except that the photoreception device 409 is mounted upside down in a turned-over state or face-down state.

As the photoreception device 409 is compact and yet can provide a sufficient area for the p-type electrode 8 similarly to the photoreception device 402, the device is suitable for mounting on the support substrate 1 with a reduced stress.

[TENTH EMBODIMENT]

Figure 14:
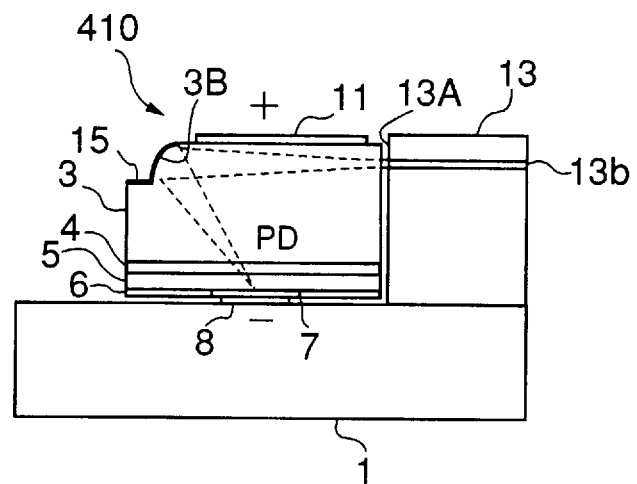
FIG. 14 is a diagram showing the construction of an optical module according to a tenth embodiment of the present invention.

FIG. 14 shows the construction of an optical module 310 according to a tenth embodiment of the present invention in a cross-sectional view, wherein those parts corresponding to the parts described previously are designated by the same reference numerals and the description thereof will be omitted.

Referring to FIG. 14, the optical module 310 includes a photoreception device 410 on the support substrate 1, wherein it will be noted that the photoreception device 410 is substantially identical with the photoreception device 404 except that the photoreception device 410 is mounted upside down in a face-down state or turned-over state. In this embodiment, too, the mounting of the photoreception device can be conducted with a minimum stressing to the photodiode PD.

[ELEVENTH EMBODIMENT]

Figure 15:
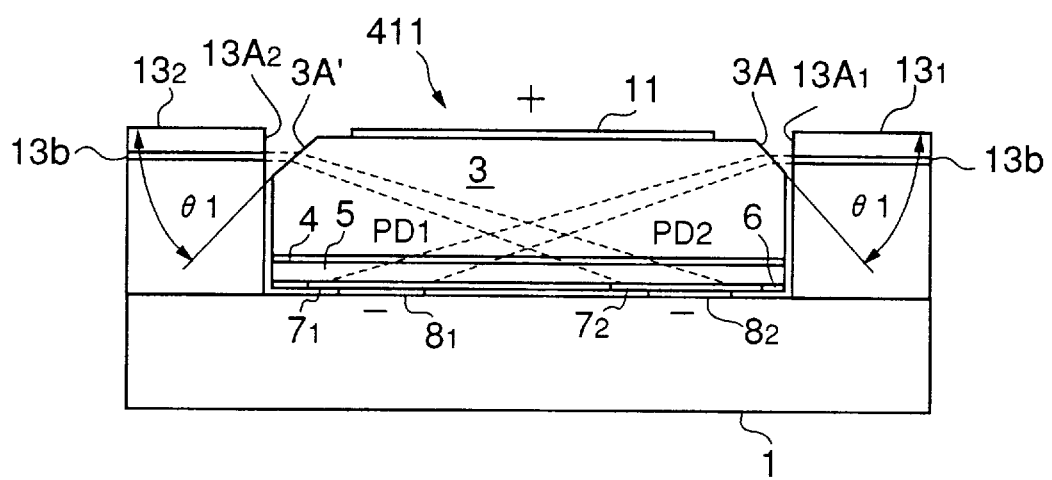
FIG. 15 is a diagram showing the construction of an optical module according to an eleventh embodiment of the present invention.

FIG. 15 shows the construction of an optical module 311 according to an eleventh embodiment of the present invention in a cross-sectional view, wherein those parts corresponding to the parts described previously are designated by the same reference numerals and the description thereof will be omitted.

Referring to FIG. 15, the optical module 311 includes a photodetection device 411 on the support substrate 1, wherein the photodetection device 411 is substantially identical with the photoreception device 405 of FIG. 9, except that the photoreception device 411 is mounted upside down in a turned-over state or face-down state.

Thus, the photoreception device 411 includes the p-type electrodes $8_1$ and $8_2$ on the bottom side thereof where the diffusion regions $7_1$ and $7_2$ are formed in correspondence to respective channels, and thus, it is possible to disperse the stress applied to the junction region $7_1$ or $7_2$ at the time of mounting of the photoreception device 411 on the support substrate 1 among the electrodes $8_1$ and $8_2$. Further, the construction of the optical module 311 is advantageous for carrying out the wiring for the respective channels simultaneously to the mechanical mounting process. It should be noted that this advantageous effect applied to all of the embodiments of FIGS. 12–17.

[TWELFTH EMBODIMENT]

Figure 16:
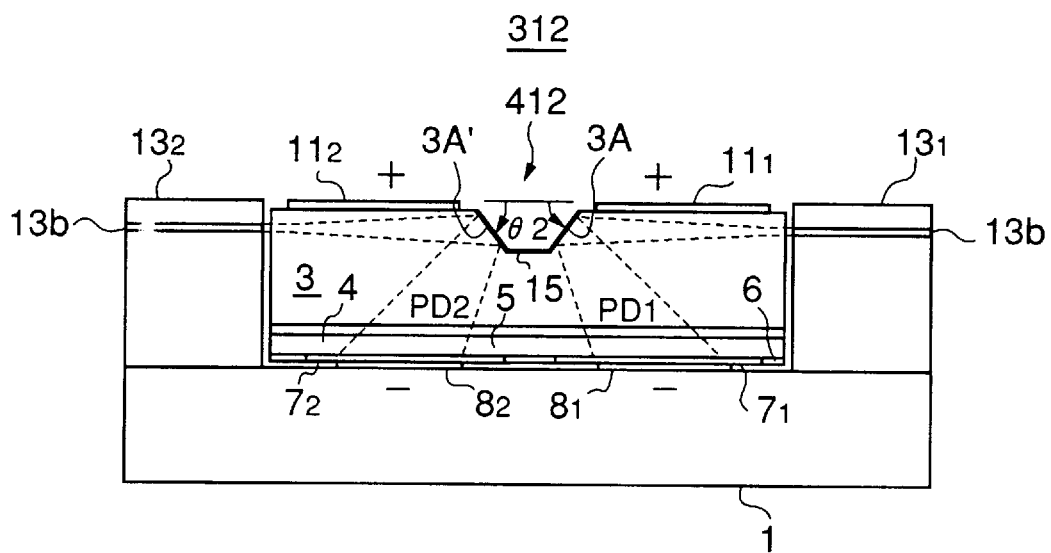
FIG. 16 is a diagram showing the construction of an optical module according to a twelfth embodiment of the present invention.

FIG. 16 shows the construction of an optical module 312 according to a twelfth embodiment of the present invention.

Referring to FIG. 16, it should be noted that the optical module 312 includes a photoreception device 412 on the support substrate 1, wherein the photoreception device 412 is substantially identical with the photoreception device 406 of FIG. 10 except that the photoreception device 406 is mounted on the support substrate 1 upside down in a turned-over state or face-down state.

In the optical module 312, it should be noted that the optical waveguides $13_1$ and $13_2$ at both lateral sides of the photoreception device 412 form a substantially flush surface with a top surface of the photoreception device 412. Further, the oblique surface 3A or 3A' is not provided in a facing relationship with the edge surface 13A of the optical waveguide $13_1$ or $13_2$. Thereby, the optical module 312 is particularly advantageous for achieving a high precision optical alignment by using a plurality of markers (not shown) provided on the photoreception device 412 in the immediate vicinity of the foregoing edge surface 13A of the optical waveguide $13_1$ or $13_2$.

[THIRTEENTH EMBODIMENT]

Figure 17:
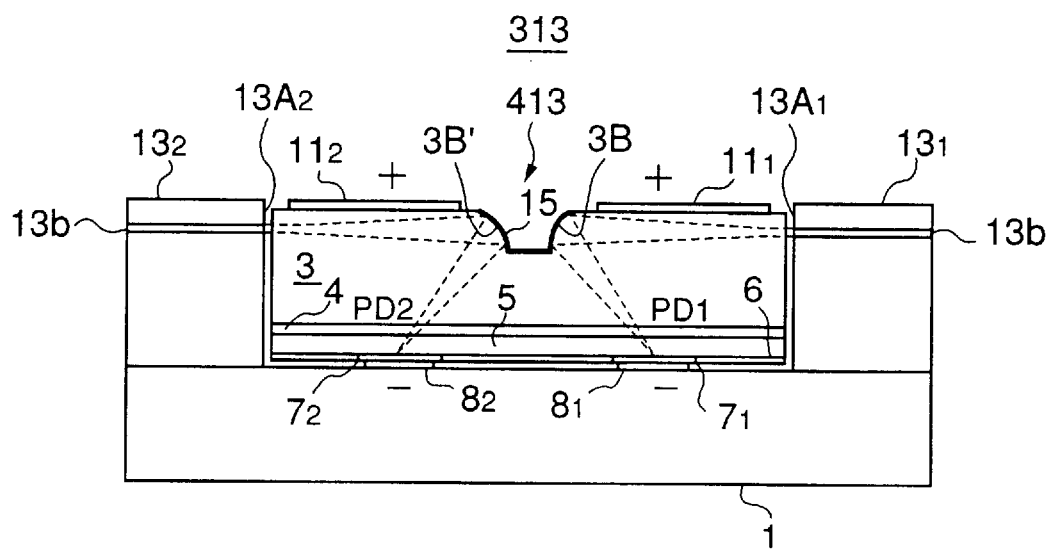
FIG. 17 is a diagram showing the construction of an optical module according to a thirteenth embodiment of the present invention.

FIG. 17 shows the construction of an optical module 313 according to a thirteenth embodiment of the present invention, wherein those parts corresponding to the parts described previously are designated by the same reference numerals and the description thereof will be omitted.

Referring to FIG. 17, the optical module 313 includes a photoreception device 413 on the support substrate 1, wherein the photoreception device 413 is substantially identical with the photoreception device 407 of FIG. 11 except that the photoreception device 413 is mounted on the support substrate 1 upside down in a turned-over state or face-down state.

In the optical module 313, too, it is possible to achieve an accurate optical alignment similarly to the previous embodiment.

Hereinafter, embodiments of the optical module according to the present invention will be described for the case in which the n-type electrode is provided on the same side where the p-type electrode is formed, with reference to FIGS. 18–25. The embodiments to be described hereinafter have a common advantageous feature in that all the necessary interconnections can be provided at the same side of the photoreception device.

[FOURTEENTH EMBODIMENT]

Figure 18:
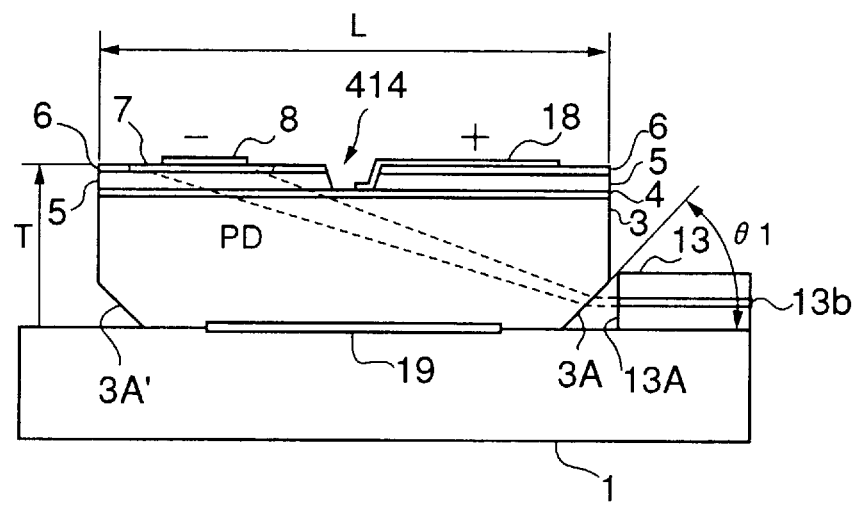
FIG. 18 is a diagram showing the construction of an optical module according to a fourteenth embodiment of the present invention.

FIG. 18 shows the construction of an optical module 314 according to a fourteenth embodiment of the present invention, wherein those parts described previously are designated by the same reference numerals and the description thereof will be omitted.

Referring to FIG. 18, the optical module 314 has a construction substantially identical to that of the optical module 301 of FIG. 4A except for the construction of a photoreception device 414 provided on the support substrate 1.

More specifically, the photoreception device 414 is formed on the device substrate 3 of n-type InP covered by a buffer layer 4 of $n^+$-type InP deposited by a planar process, similarly to the photoreception device 401 of FIG. 4A. Further, similarly to the photoreception device 401, the photoreception device 414 includes the optical absorption layer 5 of undoped InGaAs on the buffer layer 4, and the optical absorption layer 5 is covered by a layer 6 of n$^-$-type InP, and the p-type diffusion region 7 is formed in the n-type InP layer 6 by causing a diffusion of Zn.

It should be noted that the photoreception device 414 further includes a mesa region formed for example by a chemical etching process at a part adjacent to the diffusion region 7 that forms the photodiode PD, such that the mesa region exposes the buffer layer 4. In other words, the mesa region defines the region of the photoreception device 414 where the photodiode PD is formed. Thereby, the diffusion region 7 is provided with the p-type electrode 8 by stacking thereon an AuZn alloy layer and an Au layer as usual. On the other hand, the other region of the photoreception device 414 where the n-type InP layer 6 is exposed is provided with an n-type electrode 18 formed of a stacking of an AuGe alloy layer and an Au layer, wherein the n-type electrode 18 extends along the mesa side wall and reaches the InP buffer layer 4 of the n$^+$-type. Thereby, the electrode 18 establishes an ohmic contact with the buffer layer 4.

In the photoreception device 414 having a construction as such, it should be noted that no electrode is formed on the bottom side of the device substrate 3. Thus, the photoreception device 414 is suitable for a flip-chip mounting on the support substrate 1 by providing a bonding structure 19, which may be a solder layer, an adhesive layer, a brazing alloy, and the like. As the electrode 8 is provided at the top side of the device substrate 3, no stress is applied to the junction region 7 which is essential for the performance of the photodiode PD, at the time of mounting of the photoreception device 414 on the support substrate 1. Thus, the problem of increased dark current of the photodiode associated with the mounting process is successfully avoided.

Further, the optical module 314 of FIG. 18 has an advantageous feature in that the interconnection for both the power supply and signal wiring can be achieved from the top side of the mounted photoreception device 414 by way of a wire bonding process, such that a wire bonding process is applied respectively to the p-type electrode 8 and the n-type electrode 18. As a result of the wire bonding process, a positive dc voltage is supplied to the n-type electrode 18 and a load is connected to the p-type electrode 8.

In the construction of the photoreception device 414, it should be noted that the diffusion region 7 of p-type InP, the optical absorption layer 5 of undoped InGaAs, and the buffer layer 4 of n$^+$-type InP form together a pin diode, while the pin diode thus formed is reversely biased directly via the n-type electrode 18 and performs the function of the photodiode PD.

[FIFTEENTH EMBODIMENT]

Figure 19:
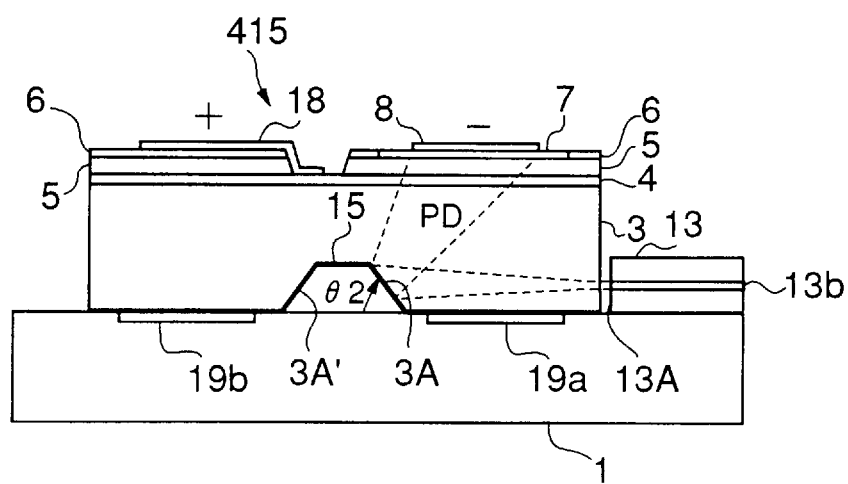
FIG. 19 is a diagram showing the construction of an optical module according to a fifteenth embodiment of the present invention.

FIG. 19 shows the construction of an optical module according to a fifteenth embodiment of the present invention in a cross-sectional view, wherein those parts corresponding to the parts described previously are designated by the same reference numerals and the description thereof will be omitted.

Referring to FIG. 19, the optical module 315 includes a photoreception device 415 on the support substrate 1, wherein the photoreception device 415 has a construction similar to that of the photoreception device 414 of FIG. 18 except that the oblique surface 3A is now provided not at the outer bottom edge of the device substrate 3 facing the optical waveguide 13 but generally at the central part of the device substrate 3. Thereby, the oblique surface 3A is covered by the reflective coating 15 and act as a reflection surface.

As the optical beam emitted from the edge surface 13A of the optical waveguide 13 is reflected back by the foregoing oblique surface 3A, it should be noted that the diffusion region 7 forming the photodiode PD is formed, in the photoreception device 415, at a side laterally opposite to the side where the photodiode is formed in the photoreception device 414. Further, the reflection surface 3A is formed with an increased size as compared with the case of the photoreception device 314 in correspondence to the increased diversion of the optical beam, which is caused in optical beam as it is emitted from the edge surface 13A of the optical waveguide and traveling to the reflection surface 3A through the device substrate 3. Further, the diffusion region 7 forming the photodiode PD is formed to have a slightly increased area in the photoreception device 415 as compared with the case of the photoreception device 414 in correspondence to the increased beam divergence of the optical beam. Similarly to the embodiment of FIG. 18, the photoreception device 415 is mounted directly on the support substrate 1 by way of solder layers 19a and 19b corresponding to the solder layer 19.

Figure 20:
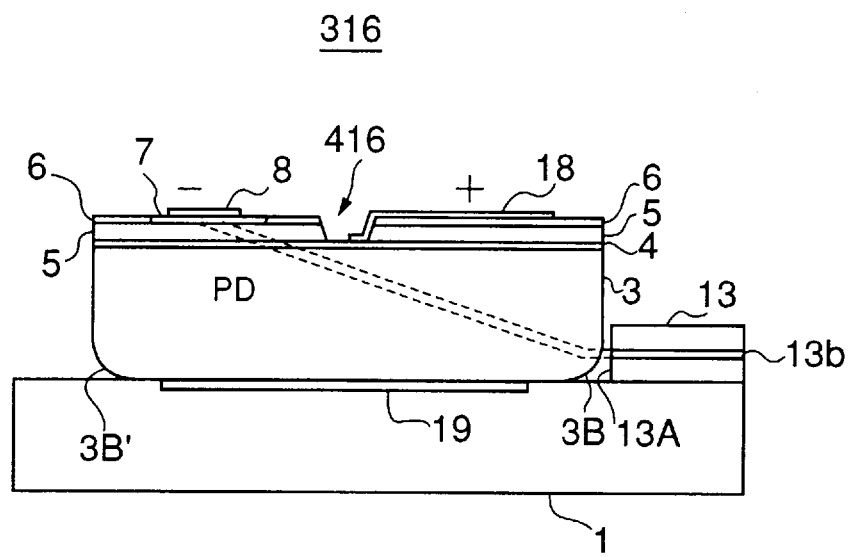
FIG. 20 is a diagram showing the construction of an optical module according to a sixteenth embodiment of the present invention.

FIG. 20 is a diagram showing the construction of an optical module 316 according to a sixteenth embodiment of the present invention, wherein those parts corresponding to the parts described previously are designated by the same reference numerals and the description thereof will be omitted.

Referring to FIG. 20, the optical module 316 includes a photoreception device 416 on the support substrate 1, wherein the photoreception device 416 has a similar construction to the photoreception device 414 except that the flat refraction surface 3A of the device substrate 3 is replaced with the curved refraction surface 3B. Otherwise, the construction of the photoreception device 416 is identical with that of the photoreception device 414. As the curved refraction surface 3B induces a focusing action in the optical beam passing therethrough, it is possible to form the photodiode PD with a reduced area in the photoreception device 416. Thereby, the response speed of the photodiode PD is improved substantially.

[SEVENTEENTH EMBODIMENT]

Figure 21:
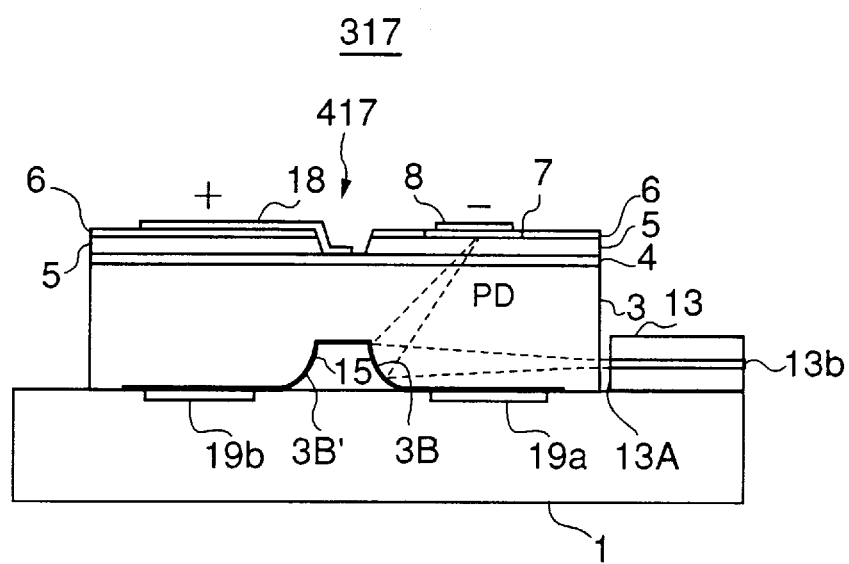
FIG. 21 is a diagram showing the construction of an optical module according to a seventeenth embodiment of the present invention.

FIG. 21 shows the construction of an optical module 317 according to a seventeenth embodiment of the present invention, wherein those parts corresponding to the parts described previously are designated by the same reference numerals and the description thereof will be omitted.

Referring to FIG. 21, the optical module 317 includes a photoreception device 417 on the support substrate 1, wherein the photoreception device 417 has a structure similar to that of the photoreception device 415 except that the photoreception device 415 includes the curved surface 3B at the central part of the device substrate 3, in place of the flat reflection surface 3A. Thereby, the curved surface 3B induces a focusing acting in the optical beam reflected by the curved surface 3B. Otherwise, the construction of the photoreception device 417 is identical with that of the photoreception device 415. As a result of focusing of the reflected optical beam, it is possible to form the photodiode PD with a reduced area in the optical module 317, and the response speed of optical detection of the photoreception device 417 is improved substantially.

[EIGHTEENTH EMBODIMENT]

Figure 22:
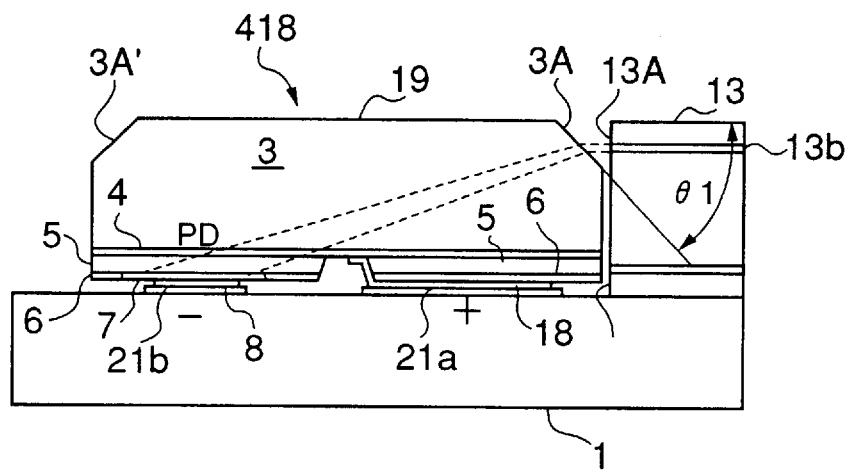
FIG. 22 is a diagram showing the construction of an optical module according to an eighteenth embodiment of the present invention.

FIG. 22 shows the construction of an optical module 318 according to an eighteenth embodiment of the present invention in a cross-sectional view, wherein those parts corresponding to the parts described previously are designated by the same reference numerals and the description thereof will be omitted.

Referring to FIG. 22, the optical module 318 includes a photoreception device 418 on the support substrate 1, wherein the photoreception device 418 has a construction substantially identical with that of the photoreception device 414 of FIG. 18 except that the photoreception device 418 is mounted on the support substrate 1 upside down in a turned-over state or face-down state.

By providing the photoreception device 418 on the support substrate 1 in such a face-down state, it is possible to achieve the wiring for the p-type electrode 8 and the n-type electrode 18 simultaneously, by merely causing a reflowing of the solder bumps covering the electrodes 8 and 18 upon respective, corresponding conductor patterns 21a and 21b formed on the support substrate 1.

[NINETEENTH EMBODIMENT]

Figure 23:
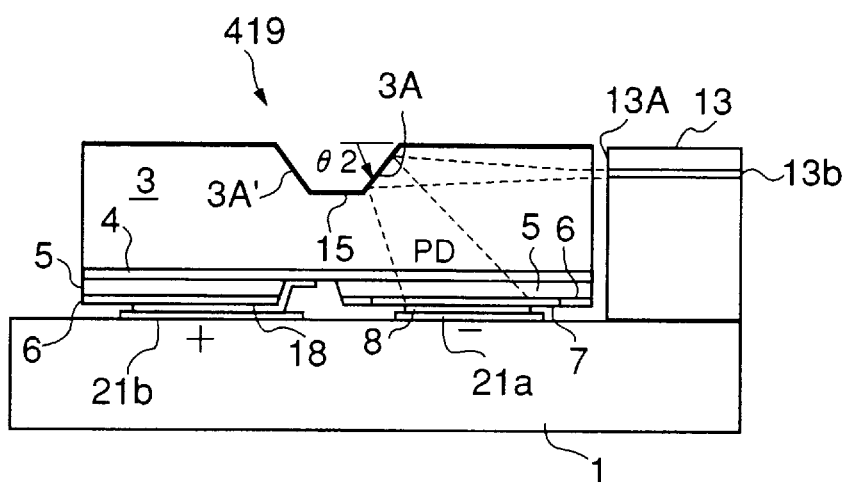
FIG. 23 is a diagram showing the construction of an optical module according to a nineteenth embodiment of the present invention.

FIG. 23 shows the construction of an optical module 319 according to a nineteenth embodiment of the present invention in a cross-sectional view, wherein those parts corresponding to the parts described previously are designated by the same reference numerals and the description thereof will be omitted.

Referring to FIG. 23, the optical module 319 includes a photoreception device 419 on the support substrate 1, wherein the photoreception device 419 is substantially identical with the photoreception device 415 of FIG. 19 except that the photoreception device 419 is mounted upon the support substrate upside down in a face-down state or a turned-over state.

[TWENTIETH EMBODIMENT]

Figure 24:
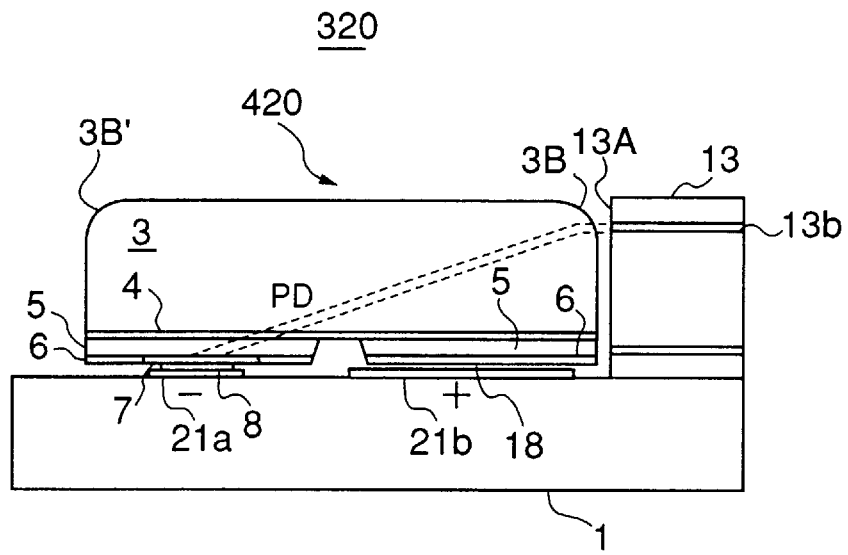
FIG. 24 is a diagram showing the construction of an optical module according to a twentieth embodiment of the present invention.

FIG. 24 shows the construction of an optical module 320 according to a twentieth embodiment of the present invention, wherein those parts corresponding to the parts described previously are designated by the same reference numerals and the description thereof will be omitted.

Referring to FIG. 24, the optical module 320 includes a photoreception device 420 on the support substrate 1, wherein the photoreception device 420 is substantially identical with the photoreception device 416 of FIG. 20 except that the photoreception device 420 is mounted on the support substrate 1 upside down in a turned-over state or face-down state.

In any of the foregoing embodiments in FIGS. 18–24, it is possible to provide the diffusion region 7 in plural numbers for detecting a plurality of optical beams similarly to the embodiment of FIGS. 5A and 5B.

[TWENTY-FIRST EMBODIMENT]

Figure 25:
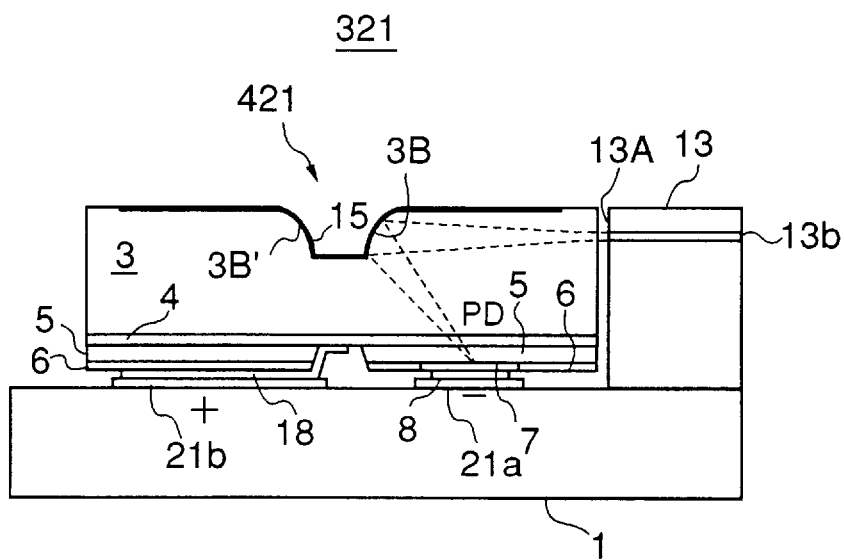
FIG. 25 is a diagram showing the construction of an optical module according to a twenty-first embodiment of the present invention.

FIG. 25 shows the construction of an optical module 321 according to a twenty-first embodiment of the present invention, wherein those parts corresponding to the parts described previously are designated by the same reference numerals and the description thereof will be omitted.

Referring to FIG. 25, the optical module 321 includes a photoreception device 421 on the support substrate 1, wherein the photoreception device 421 is substantially identical with the photoreception device 417 of FIG. 21 except that the photoreception device 421 is mounted on the support substrate 1 upside down in a turned-over state or face-down state.

It should be noted that any of the optical modules 314–321 described heretofore with reference to FIGS. 18–25 can be modified to include a plurality of optical waveguides similarly to the embodiments of FIGS. 9–11 or FIGS. 15–17.

[TWENTY-SECOND EMBODIMENT]

Figure 26A:
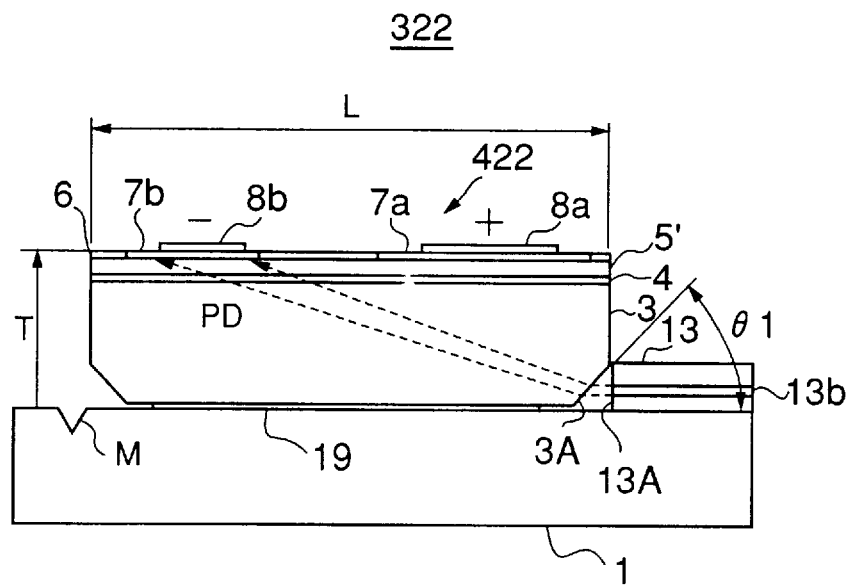
FIGS. 26A and 26B are diagrams showing an optical module according to twenty-second embodiment of the present invention.

FIG. 26A shows the construction of an optical module 322 according to a twenty-second embodiment of the present invention, wherein those parts corresponding to the parts described previously are designated by the same reference numerals and the description thereof will be omitted.

Figure 1A:
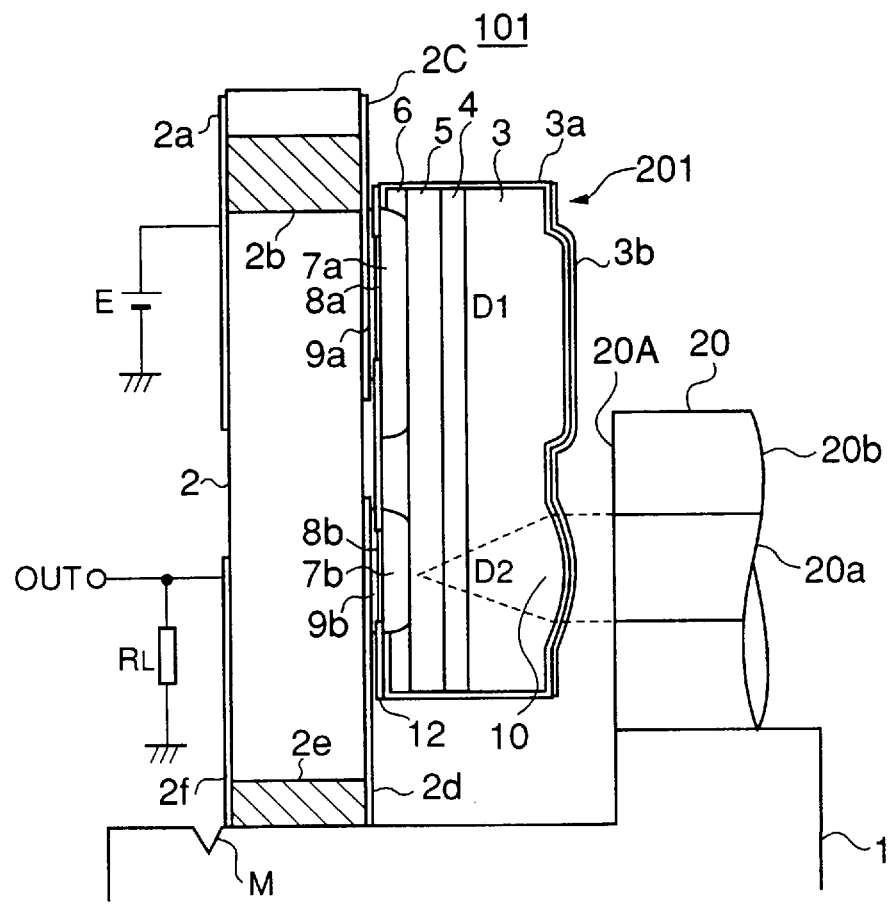
FIGS. 1A and 1B are diagrams showing the construction of a conventional optical module and the equivalent circuit diagram thereof.
Figure 1B:
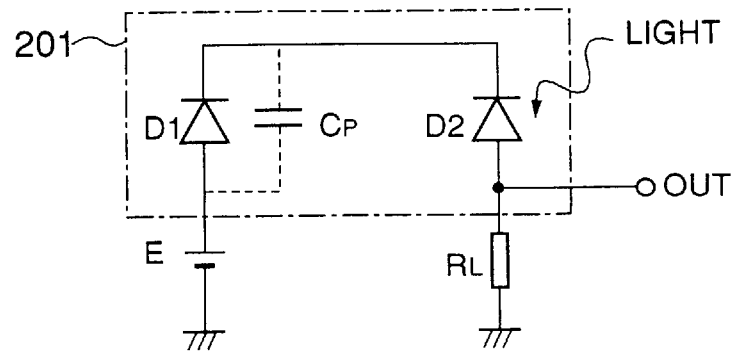
Figure 3A:
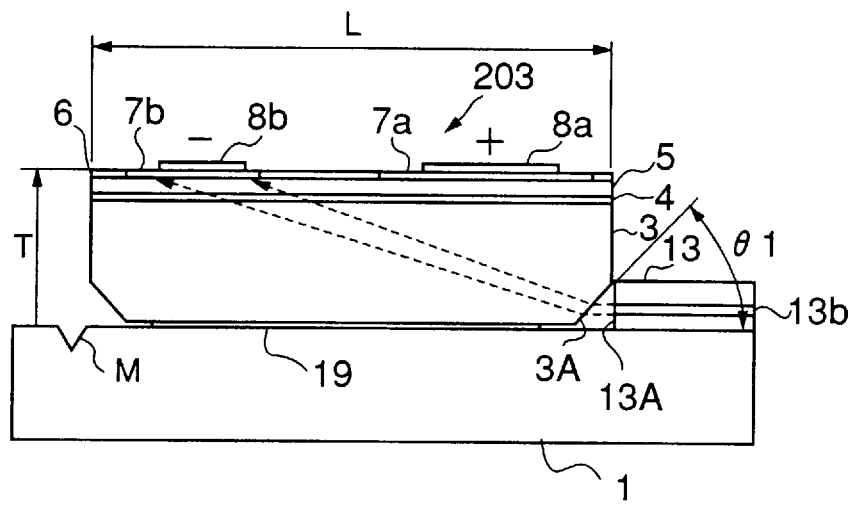
FIGS. 3A and 3B are diagrams showing respectively the construction of still other conventional optical modules.
Figure 3B:
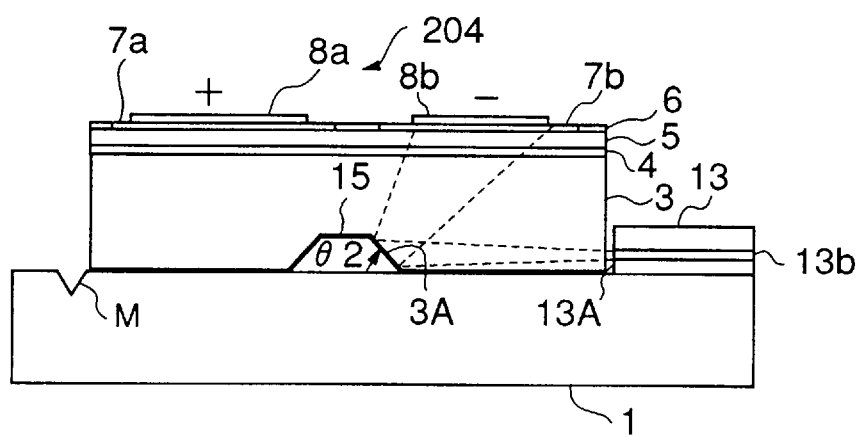

Referring to FIG. 26A, the optical module 322 includes a photoreception device 422 on the support substrate 1 and has a construction substantially identical to that of the conventional optical module 103 of FIG. 3A except for the construction of the photoreception device 422.

More specifically, the photoreception device 422 has a structure similar to the structure of the photoreception device 203 of FIG. 3A and includes the oblique surface 3A formed on the device substrate 3 and p-type electrodes 8a and 8b respectively in correspondence to the diffusion regions 7a and 7b, The photoreception device 422 is distinct over the photoreception device 203 in the point that the photoreception device 422 includes an optical absorption layer 5' of undoped InGaAsP in place of the optical absorption layer 5 of undoped InGaAs, wherein the composition of the optical absorption layer 5' is adjusted such that the optical absorption layer 5' has a bandgap energy Eg tuned with respect to the wavelength $\lambda_g$ of the optical beam to be detected.

Figure 26B:
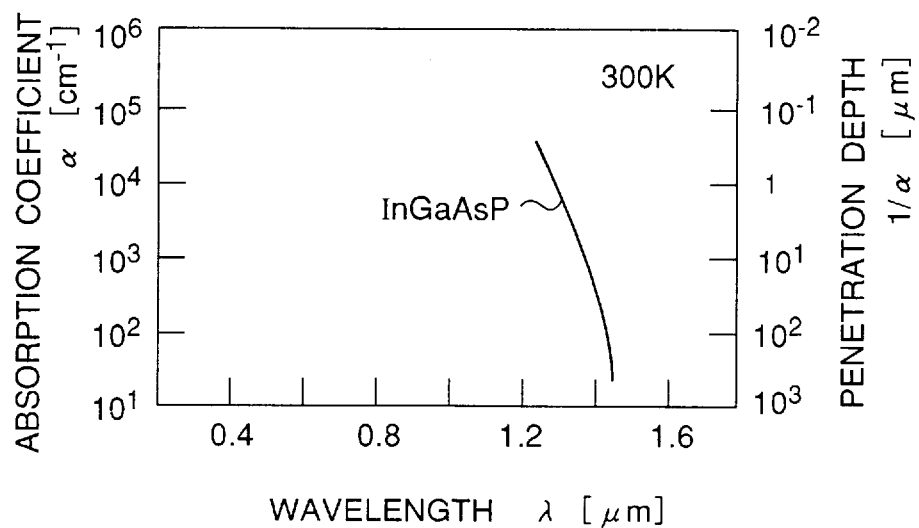

FIG. 26B shows an example of the wavelength dependence of the fundamental absorption coefficient of InGaAsP.

Referring to FIG. 26B, InGaAsP is a so-called direct-transition type semiconductor material forming a mixed crystal and is characterized by the absorption coefficient α that rises sharply with a decrease of the wavelength in a short-wavelength direction. Thus, by suitably setting the composition of the InGaAsP mixed crystal, it is possible to tune the bandgap energy Eg to the wavelength λg to be detected, which may be 1.31 μm, for example. In the illustrated example, it will be seen that the absorption coefficient α increases steeply at the wavelength of about 1.4 μm.

It should be noted that the thickness of the optical absorption layer 5' is approximately determined based upon the value of the absorption coefficient α of the InGaAsP mixed crystal at the wavelength λg to be detected, as the penetration depth of the optical beam is given by the relationship of 1/α [μm]. In the present case, the thickness of the optical absorption layer 5' for an incoming optical beam having the wavelength λg is set to several tens of microns, in order to achieve the quantum coefficient of 80 μm or more for the optical beam of which wavelength λg is 1.31 μm.

When the photoreception device 422 having such a construction is exposed to two optical beams both emitted from the optical waveguide 13 with respective wavelengths λg of 1.31 μm and 1.55 μm, for example, the optical beam having the wavelength λg of 1.31 μm is absorbed efficiently by the optical absorption layer 5' and thus detected with high sensitivity. On the other hand, the optical beam of the wavelength λg of 1.55 μm, which is longer than the point of the sharp rise of the optical absorption coefficient α, passes through the optical absorption layer 5' without a substantial absorption due to the insufficient thickness of the optical absorption layer 5'. In other words, the photoreception device 422 detects the optical beam of the wavelength of 1.31 μm selectively.

Thus, the photoreception device 422 of the present embodiment is suitable for an optical telecommunication system that uses optical beams of different wavelengths. As the photoreception device 422 thus having the selectivity of the optical wavelength can eliminate the use of a wavelength filter for filtering the incoming optical beam, the optical module 322 reduce the number of the components used therein. Thereby, the fabrication of the optical module 322 is substantially facilitated.

It should be noted, however, that the foregoing selectivity of optical wavelength is applicable to all of the photoreception devices described heretofore. Further, it should be noted that the material forming the optical absorption layer 5' is by no means limited to the foregoing mixed crystal of InGaAsP.

It should be noted that the multilayer optical filter structure 4' can be used in any of the embodiments described heretofore or to be described hereinafter, by merely substituting the buffer layer 4.

[TWENTY-THIRD EMBODIMENT]

Figure 27A:
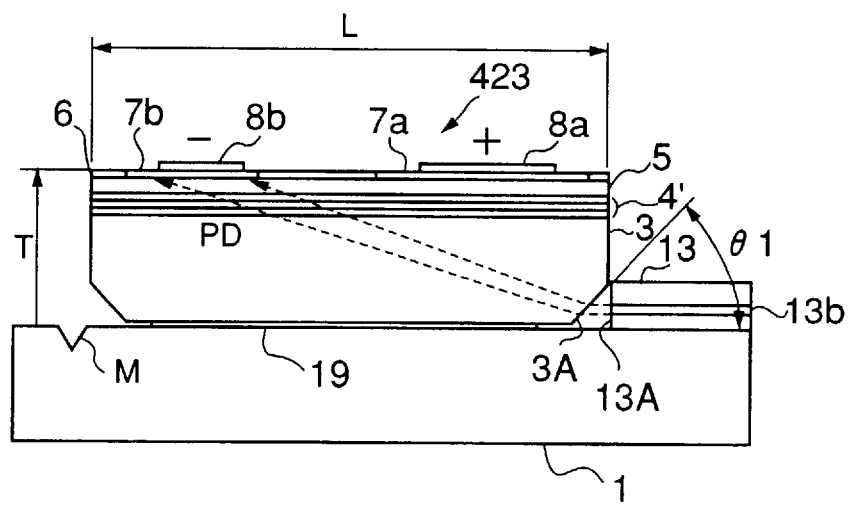
FIGS. 27A and 27B are diagrams showing an optical module according to a twenty-third embodiment of the present invention.

FIG. 27A shows the construction of an optical module 323 according to a third embodiment of the present invention in a cross sectional view, wherein those parts corresponding to the parts described previously are designated by the same reference numerals and the description thereof will be omitted.

Referring to FIG. 27A, the optical module 323 includes a photoreception device 423 on the support substrate 1 and has a construction substantially identical with that of the conventional optical module 103 of FIG. 3A except for the construction of the photoreception device 423.

Thus, the photoreception device 423 is distinct over the conventional photoreception device 203 in the point that the photoreception device 423 includes a buffer layer 4' forming a $\lambda/4$-multilayer reflection structure in place of the buffer layer 4 between the device substrate 3 and the optical absorption layer 5. By using such a $\lambda/4$-multilayer reflection structure, the optical beam incident to the photoreception device 423 is filtered as a result of the interference occurring in the $\lambda/4$-multilayer reflection structure 4', and the optical beam of the desired wavelength $\lambda g$ alone is efficiently supplied to the optical absorption layer 5.

Figure 27B:
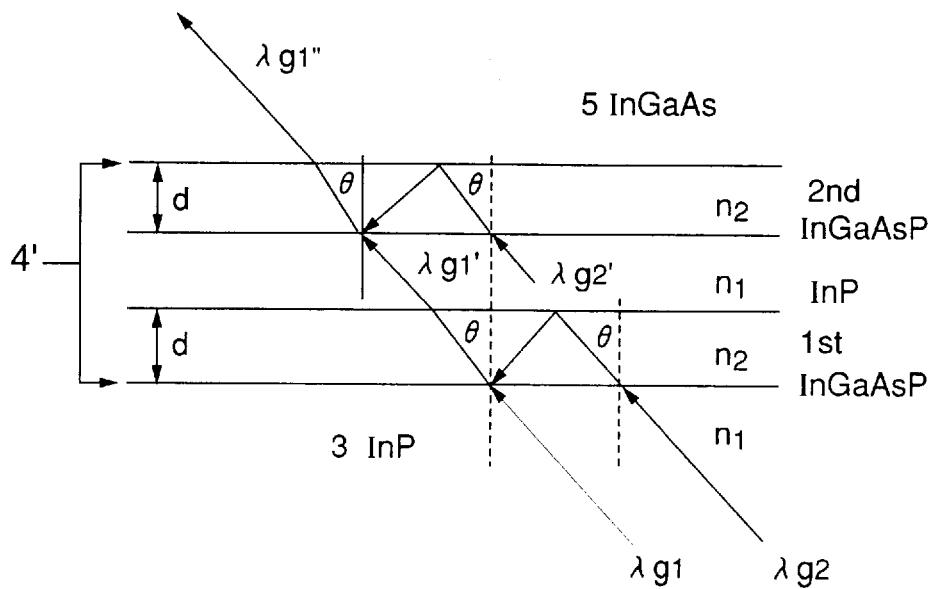

FIG. 27B shows $\lambda/4$-multilayer reflection structure 4' in detail.

Referring to FIG. 27B, the $\lambda/4$-multilayer reflection structure 4' includes an alternate stacking of InP and InGaAsP layers, in which each of the InGaAsP layers has a thickness d corresponding to about one-quarter ($1/4$) the wavelength $\lambda g$ of the optical beam to be detected. Further, each of the InGaAsP layers has a refractive index $n_2$ that is larger than a refractive index $n_1$ of the InP layer ($n_2 > n_1$).

In the $\lambda/4$-multilayer reflection structure 4' having such a construction, the optical beams $\lambda_{g1}$ and $\lambda_{g2}$ incident to the lowermost InGaAsP layer with a wavelength $\lambda g$ cause a constructive interference when the condition $2 \times d \cdot n \cdot \cos\Theta = m\lambda g$ is met, where m is an arbitrary integer. On the other hand, when the wavelength $\lambda g$ does not meet the foregoing condition, or when the wavelength $\lambda g$ meets the condition of $2 \times d \cdot n \cdot \cos\Theta = (2m+1)\lambda g/2$, the foregoing constructive interference is lost or a destructive interference occurs. Thus, as a result of the constructive interference, optical beams $\lambda_{g1}'$ and $\lambda_{g2}'$ are produces from the optical beams $\lambda_{g1}$ and $\lambda_{g2}$ respectively.

Further, the optical beams $\lambda_{g1}'$ and $\lambda_{g2}'$ thus passed through the first InGaAsP layer with the constructive interference then experience a second constructive interference in the second InGaAsP layer located above the InP layer, provided that the foregoing condition $2 \times d \cdot n \cdot \cos\Theta = m\lambda g$ is met, Thereby, a strong optical beam having a selected wavelength $\lambda g$ impinges upon the optical absorption layer 5 above the $\lambda/4$-multilayer reflection structure 4' with a selected wavelength $\lambda g$, and a high sensitivity optical detection becomes possible. It should be noted that the number of the stacking of the InGaAsP layer and the InP layer is not limited to the case illustrated in FIG. 27B.

Hereinafter, the construction of the optical modules having a feature in the alignment with a photoreception device and an optical waveguide or optical fiber will be described.

[TWENTY-FOURTH EMBODIMENT]

Figure 28A:
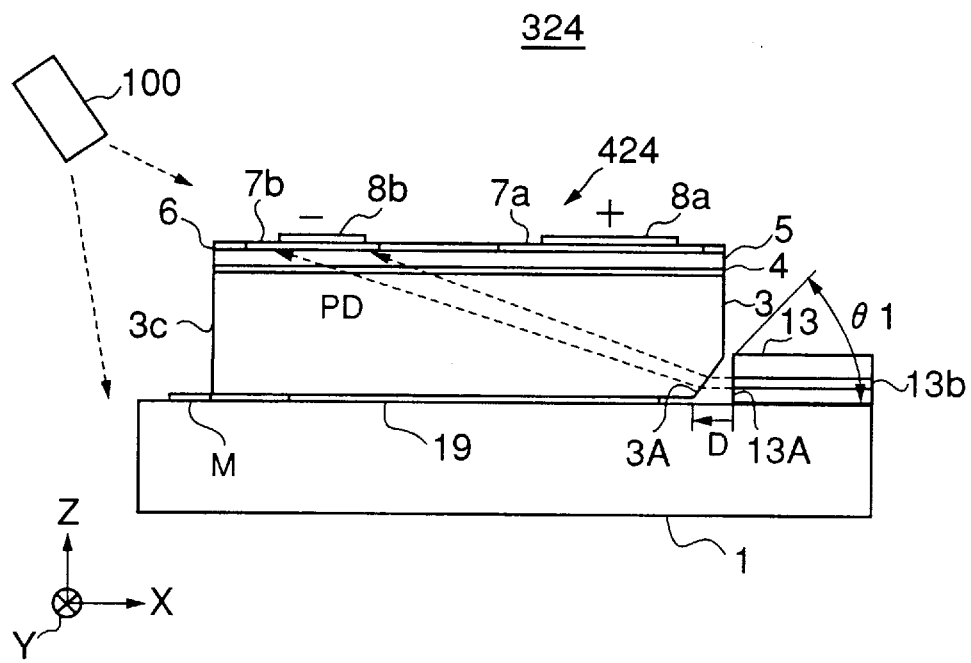
FIGS. 28A and 28B are diagrams showing the construction of an optical module according to a twenty-fourth embodiment of the present invention respectively in a side view and a rear view.
Figure 28B:
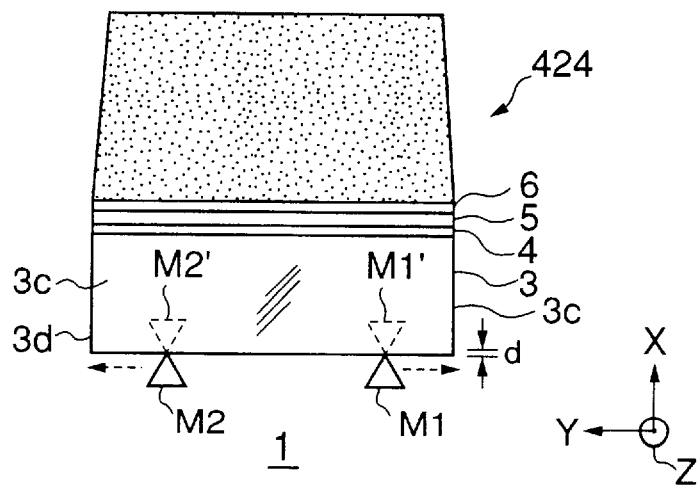

FIGS. 28A and 28B show the construction of an optical module 324 according to a twenty-fourth embodiment of the present invention respectively in a cross-sectional view and a rear view, wherein those parts corresponding to the parts described previously are designated by the same reference numerals and the description thereof will be omitted.

Referring to FIG. 28A, the optical module 324 includes a photoreception module 424 on the support substrate and has a construction substantially identical with that of the conventional optical module 103 of FIG. 3A except for the construction of the photoreception module 424. More specifically, the oblique surface 3A' of the photoreception device 203 used in the optical module 103 is eliminated in the photoreception module 424 and a rear side wall 3C of the device substrate 3 is now defined by a vertical wall vertical to the principal surface of the device substrate 1, wherein the vertical side wall 3C may be formed by a cleaved surface or a polished surface and forms an excellent mirror surface.

In the optical module of the type of the present invention, the photoreception device such as the photoreception 424 is generally mounted on the support substrate 1 manually or automatically by using a monitoring camera 100 that observes the rear side of the photoreception device 424. Thereby, an mirror image of a marker M, which is provided on the support substrate 1 for alignment, is formed at such a mirror surface and a high precision optical alignment becomes possible for the photoreception device 424 by observing such a mirror image by the camera 100.

FIG. 28B shows the optical module 324 as viewed from a rear upward direction thereof, in other words, in the direction of the camera 100.

Referring to FIG. 28B, the support substrate 1 carries markers M1 and M2 of a triangular shape thereon such that the markers M1 and M2 are aligned in a Y-direction or width direction of the optical module 324. Thus, while using the markers M1 and M2 as a reference, a hand mechanism (not shown) that holds the photoreception device 424 is driven such that the photoreception device 424 is mounted properly on the support substrate 1. Thereby, mirror images M1' and M2' of the markers M1 and M2 are observed by the camera 100, and the alignment of the photoreception device 424 is achieved on the support substrate 1 by driving the hand mechanism under a manual control or a control of a controller not illustrated while observing the mirror images M1' and M2' such that a distance d indicated in FIG. 28B becomes zero. In this aligned state, it should be noted that an apex of the triangular mirror image M1' coincides with an apex of the corresponding triangular image M1 and an apex of the triangular mirror image M2' coincides with an apex of the corresponding triangular image M2. It should be noted that the mirror images M1' and M2' on the support substrate 1 are in a co-planar relationship with the markers M1 and M2 on the support substrate 1. Thus, the observation of the mirror images M1' and M2' can be achieved while focusing the camera 100 to the markers M1 and M2.

Thus, the photoreception device 424 is mounted on the support substrate 1 with an exact alignment of the rear side wall 3C in the Y-direction, and the distance D between the front edge surface 13A of the optical waveguide 13 and the oblique surface 3A is controlled exactly. In this case, it should be noted that the possible positional offset of the photoreception device 424 in the direction parallel to the Y-axis is successfully suppressed by controlling the hand mechanism such that distance between the marker M1 and a corresponding lateral side wall edge 3c of the device substrate 3 is identical to the distance between the marker M2 and a corresponding lateral side wall edge 3d of the device substrate 3.

Alternatively, it is possible to move the markers M1 and M2 in the direction indicated by arrows in FIG. 28B respectively in alignment with the side wall edges 3c and 3d of the device substrate 3. In this case, too, it is possible to carry out an exact alignment of the photoreception device 424 by using the mirror images of the markers M1 and M2, wherein the alignment is achieved simultaneously in the X-direction and in the Y-direction.

It should be noted that the shape or number of the marker M is not limited to the embodiment described above. For example, a similar effect is achieved also by using a single rectangular or trapezoidal marker. Further, it is also possible to provide, instead of using the side wall edges 3c and 3d, small markers on the mirror surface 3C such that the small markers do not interfere with the mirror images M1' and M2' on the mirror surface 3C. The various markers noted above may be formed by a conductor pattern or alternatively in the form of a v-shaped etch pit.

Figure 29A:
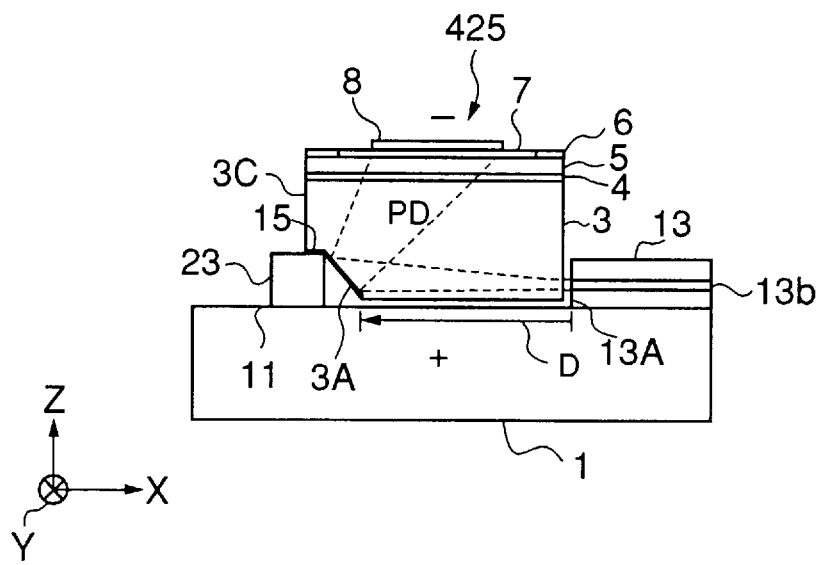
FIGS. 29A and 29B are diagrams showing the construction of an optical module according to a twenty-fifth embodiment of the present invention respectively in a side view and a rear view.
Figure 29B:
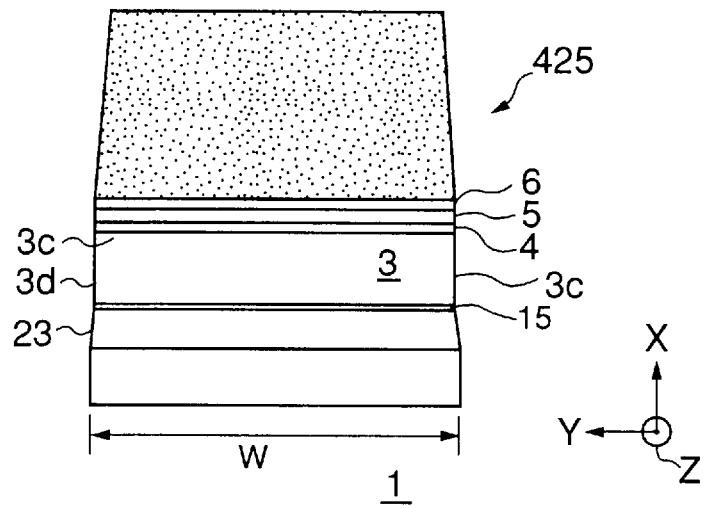

FIGS. 29A and 29B show the construction of an optical module 325 according to a twenty-fifth embodiment of the present invention respectively in a cross-sectional view and a rear view, wherein those parts corresponding to the parts described previously are designated by the same reference numerals and the description thereof will be omitted.

Referring to FIG. 29A, the optical module 325 includes a photoreception device 425 on the support substrate 1 and has a construction substantially identical with that of the conventional optical module 103 of FIG. 3A except for the construction of the photoreception device 425. More specifically, the support substrate 1 carries thereon a projection 23, and the photoreception device 425 is mounted on the support substrate 1 such that the foregoing projection 23 engages with a top part of the oblique surface 3A. Thus, by causing an engagement between the foregoing top part of the oblique surface 3A and the projection 23, the photoreception device 425 is positioned exactly on the support substrate 1.

FIG. 29B shows the optical module 325 from the rear upper direction similarly to FIG. 28B.

Referring to FIG. 29B, it will be noted that the support substrate 1 is formed with the projection 23 with a width W identical with the width of the photoreception device 425, such that the projection 23 extends in the Y-direction. Thereby, the photoreception device 425 is mounted on the support substrate 1 such that the top edge of the projection 23 contacts with the top edge of the oblique surface 3A where the oblique surface 3A and a horizontal surface merge with each other. As a result of such a simple mounting process, the photoreception device 425 is set parallel with the Y-axis. Further, the distance D between the edge surface 13A of the optical waveguide 13 and the reflection surface 3A is set exactly to the nominal value. Further, the optical module 325 of the present embodiment provides further advantageous features in that lateral offset in the Y-direction or rotation about a Z-axis is eliminated for the photoreception device 425 on the support substrate 1.

It should be noted that the width W of the projection 23 may be larger or smaller than the width of the photoreception device 425. If necessary, a separate marker may be provided on the projection 23 and on the photoreception device 425 for the proper positioning in the Y-direction.

[TWENTY-SIXTH EMBODIMENT]

Figure 30:
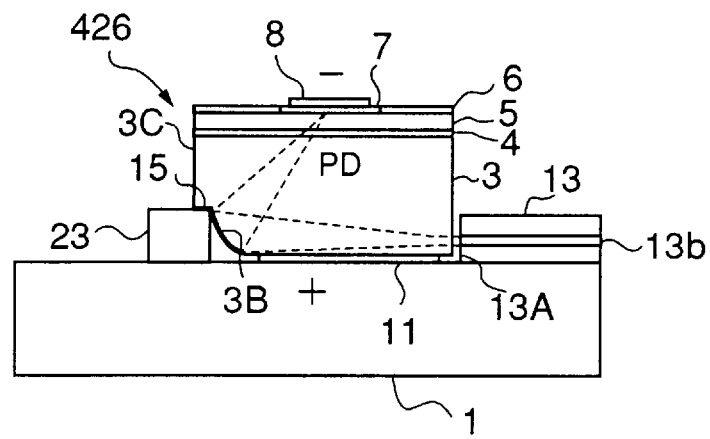
FIG. 30 is a diagram showing the construction of an optical module according to a twenty-sixth embodiment of the present invention.

FIG. 30 shows the construction of an optical module 326 according to a twenty-sixth embodiment of the present invention, wherein those parts corresponding to the parts described previously are designated by the same reference numerals and the description thereof will be omitted.

Referring to FIG. 30, the optical module 326 includes a photoreception device 426 on the support substrate 1 wherein the optical module 326 has a construction substantially identical with that of the conventional optical module 301 of FIG. 4A except that the curved surface 3B of the device substrate 3 engages with the projection 23 formed on the principal surface of the support substrate 1. Thus, by contacting the projection 23 to the top part of the curved surface 3B, it is possible to position the photoreception device 426 on the support substrate 1 exactly.

[TWENTY-SEVENTH EMBODIMENT]

Figure 31:
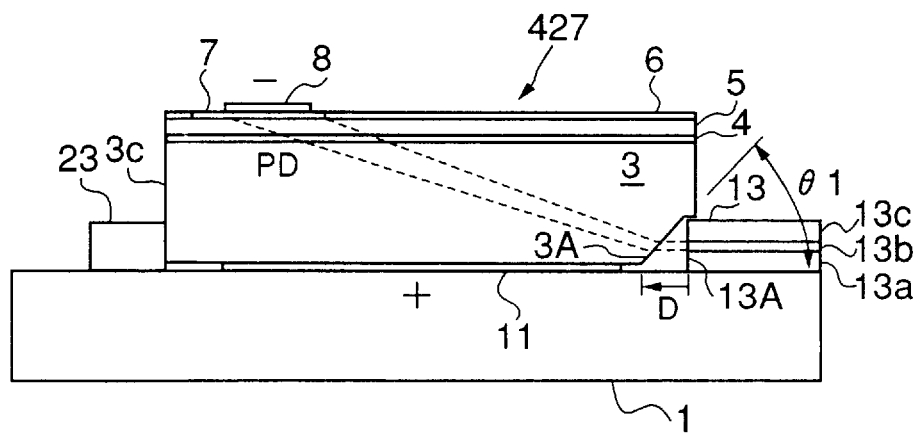
FIG. 31 is a diagram showing the construction of an optical module according to a twenty-seventh embodiment of the present invention.

FIG. 31 shows the construction of an optical module 327 according to a twenty-seventh embodiment of the present invention, wherein those parts corresponding to the parts described previously are designated by the same reference numerals and the description thereof will be omitted.

Referring to FIG. 31, the optical module 327 includes a photoreception device 427 on the support substrate 1 and has a construction substantially identical with that of the conventional optical module 301 of FIG. 4A except that the photoreception device 427 lacks a chamfered structure at the rear side thereof. In other words, the device substrate 3 of the photoreception device 427 is defined at the rear side thereof by the vertical rear wall 3C, which may be cleaved or polished similarly to the embodiment of FIG. 28A. The rear side wall 3C thus formed engages with the projection 23 on the support substrate 1 in the properly positioned state of the photoreception device 427 on the support substrate 1.

[TWENTY-EIGHTH EMBODIMENT]

Figure 32A:
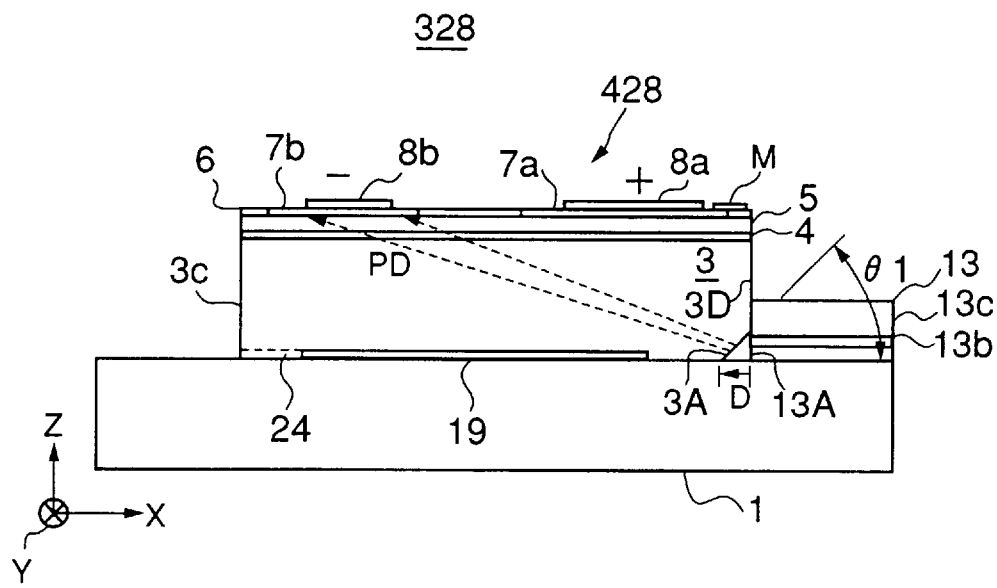
FIG. 32A and 32B are diagrams showing the construction of an optical module according to a twenty-eighth embodiment of the present invention respectively in a side view and a rear view.
Figure 32B:
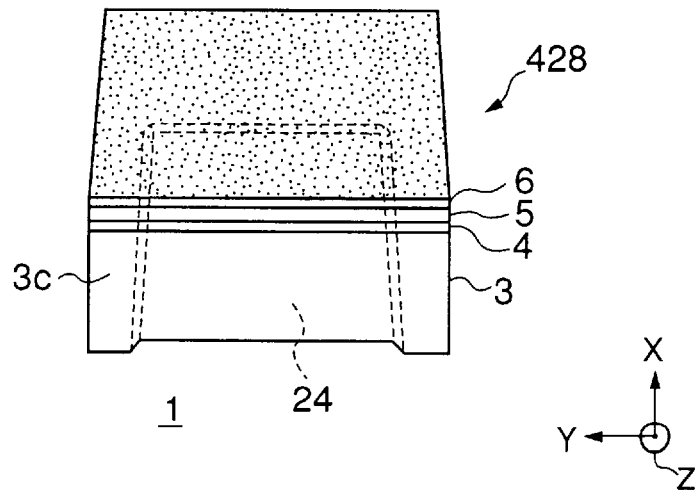

FIGS. 32A and 32B show the construction of an optical module 328 according to a twenty-eighth embodiment of the present invention respectively in a cross-sectional view and a rear view, wherein those parts corresponding to the parts described previously are designated by the same reference numerals and the description thereof will be omitted.

Referring to FIG. 32A, the optical module 328 includes a photoreception device 428 on the support substrate 1 and has a construction substantially identical with that of the conventional optical module 103 of FIG. 3A except that the upper cladding layer 13c of the optical waveguide 13 is formed with an increased thickness for allowing an engagement with a vertical reception surface 3D at the front side of the device substrate 3 for proper positioning of the photoreception device 428 on the support substrate 1 in the X-direction. For this purpose, it is advantageous to from the surface 3D by a cleaving process. Further, the marker M, which is now provided at the top surface of the device 428 adjacent to the foregoing reception surface 3D, is used for positioning the photoreception device 328 in the Y-direction.

The photoreception device 328 is mounted on the support substrate 1 by bonding the bottom side of the device substrate 3 on a bonding medium such as a solder alloy, a braze metal, a thermoplastic adhesive, and the like, provided on the support substrate 1. In such a bonding process, there tends to occur the problem of overflow of the bonding medium from the junction interface where the photoreception device 428 is contacted to the device substrate 1 upon a heat treatment of the optical module particularly when the amount of the bonding medium used is excessive. The bonding medium thus caused the overflow may flow to the oblique surface 3A, the incidence of the optical beam is interrupted.

In order to prevent this problem, the photoreception device 428 of the present embodiment includes a vent structure 24 for allowing the excessive bonding medium to escape to the rear side of the photoreception device 428. By providing such a vent structure 24, the reliability of the mounting process is improved substantially.

FIG. 32B indicates a part of the optical module 328 from the upper rear direction.

Referring to FIG. 32B, it will be noted that the vent 24 is exposed at the rear side wall 3C, and the excessive bonding medium escapes effectively to the rear side of the photoreception device 428 through such a vent 24.

[TWENTY-NINTH EMBODIMENT]

FIGS. 33A–33E show the construction of an optical module 329 as well as various modifications thereof, wherein those parts corresponding to the parts described previously are designated by the reference numerals and the description thereof will be omitted.

Figure 33A:
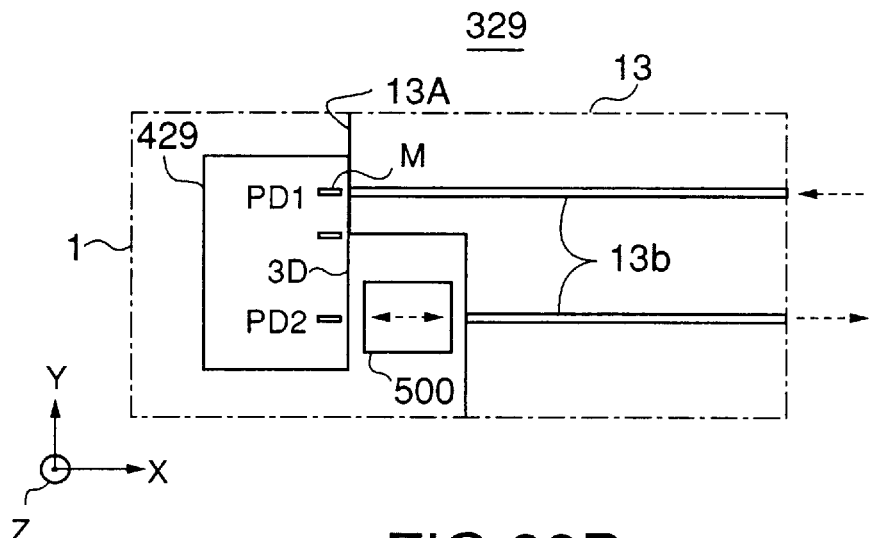

Referring to FIG. 33A showing the optical module 329 in a plan view, it will be noted that the support substrate 1 carries the optical waveguide 13 having an inverted L-shaped form in the plan view, and a photoreception device 429 is mounted on the support substrate 1 such that the photoreception device 429 establishes an engagement contact with the edge surface 13A of the optical waveguide 13 at the front surface 3D of the photoreception device 429. On the other hand, there is formed a space between the photoreception device 429 and a receded part of the optical waveguide 13, and a laser diode 500 is mounted on the support substrate 1 in correspondence to such a space.

It should be noted that the optical waveguide 13 of FIG. 33A includes two cores 13b, wherein one of which is coupled optically to a photodiode PD1 formed in the photoreception device 429 and injects an optical beam therein to the photodiode PD1, while the other core 13b is coupled optically to the laser diode 500 and guides a laser beam emitted from the laser diode 500. The laser diode further emits an optical beam in the backward direction simultaneously, wherein the photoreception device 429 further includes a second photodiode PD2 in alignment with the laser diode 500 for receiving the optical beam emitted in the backward direction. By monitoring the optical output of the laser diode 500 by the photodetector PD2, it is possible to control the output of the laser diode 500 constant by way of a driving circuit not illustrated. It should be noted that the photoreception device 429 may have any cross-sectional structure described with reference to the previous embodiments.

As indicated in FIG. 33A, the photoreception device 429 carries three markers M on the top surface thereof, wherein the upper two of the markers M in the illustration are used for the alignment of the photoreception device 429 with respect to the optical waveguide 13. More specifically, the uppermost marker M in the illustration of FIG. 33A is aligned with the core 13b for the incoming optical beam to the photodiode PD1, while the marker M immediately below is used for aligning the front end corner of the optical waveguide 13. Further, it is possible to form the markers also on the optical waveguide 13.

The laser diode 500, on the other hand, also carries markers, though not shown, at the respective locations indicated by arrows in FIG. 33A, wherein the markers on the laser diode 500 are aligned on the one hand with the lowermost marker M of the photoreception device 429 corresponding to the photodiode PD2 and further with the core 13b used for guiding the outgoing optical beam. Thereby, the laser diode 500 is easily and exactly positioned properly. The construction of the optical module 329 of FIG. 33A is particularly suitable for reducing the number of the components. In addition, the photoreception device 429 and the laser diode 500 are mounted without a substantial positional adjustment, except for a mere abutting process and a simple alignment process conducted by using the markers M.

Figure 33B:
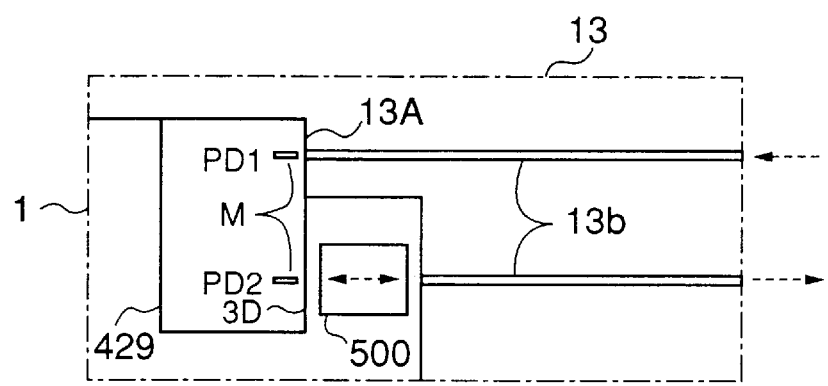

FIG. 33B shows a modification of the optical module 329.

Referring to FIG. 33B, it should be noted that an upper part of the optical waveguide 13 in the illustration is extended further toward the photoreception device 429 for enabling an abutting of not only the front side but also the lateral side of the photoreception device 429 to the optical waveguide 13. Thereby, it is possible to achieve the positional alignment of the photoreception device 429 for not only in the X-direction but also in the Y-direction simultaneously. In the embodiment of FIG. 33B, the upper marker M is used merely for the confirmation of the proper positioning.

Figure 33C:
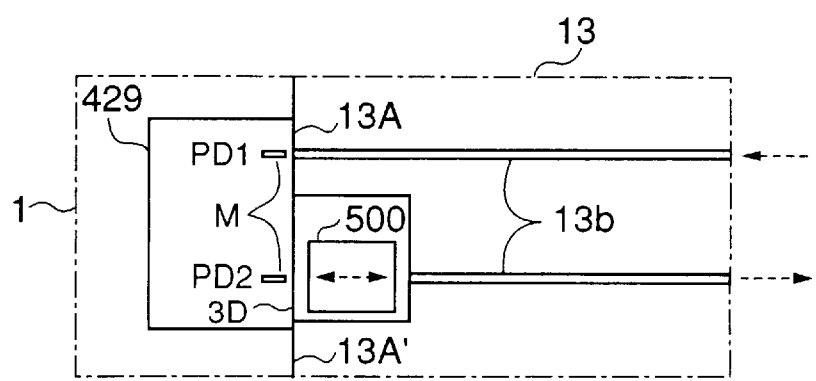

FIG. 33C shows a further modification of the optical module 329.

Referring to FIG. 33C, the optical waveguide 13 is formed to have a U-shaped end, and thus, the photoreception device 429 is abutted not only to the edge surface 13A at a first leg part of the U-shaped end but also to an edge surface 13A' at a second leg part of the U-shaped end. Thereby, it is possible to achieve a proper positioning in the X-direction without a substantial adjustment. On the other hand, the positioning in the Y-direction is achieved by using the alignment markers M.

Figure 33D:
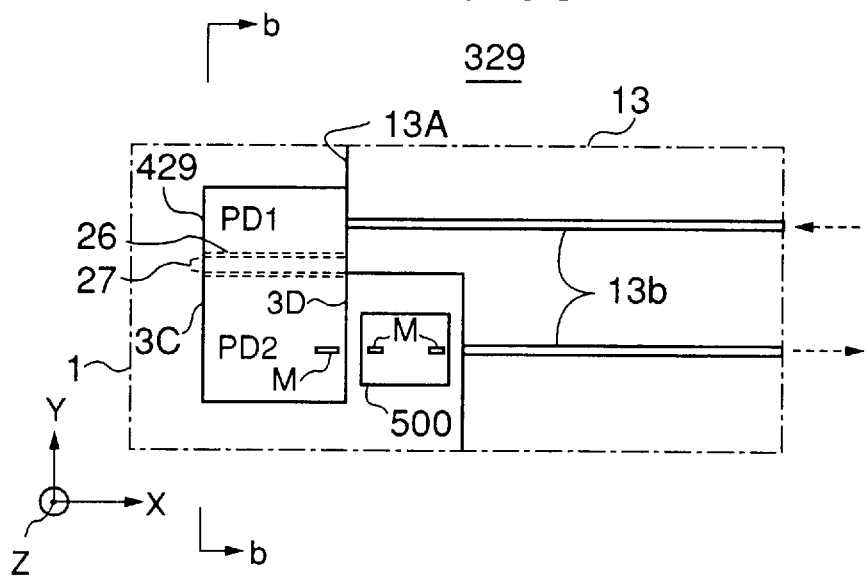

FIG. 33D shows a still further modification of the optical module 329.

Referring to FIG. 33D, the optical module is fundamentally the same to that of FIG. 33D, except that a part 27 of the optical waveguide 13 extends over the surface of the support substrate 1 in the direction parallel to the optical axis of the optical waveguide 13. Thereby, the part 27 of the optical waveguide 13 acts as a guide rail in engagement with a corresponding guide groove 26 provided on the bottom side of the device substrate 3 forming the photoreception device 329.

Figure 33E:
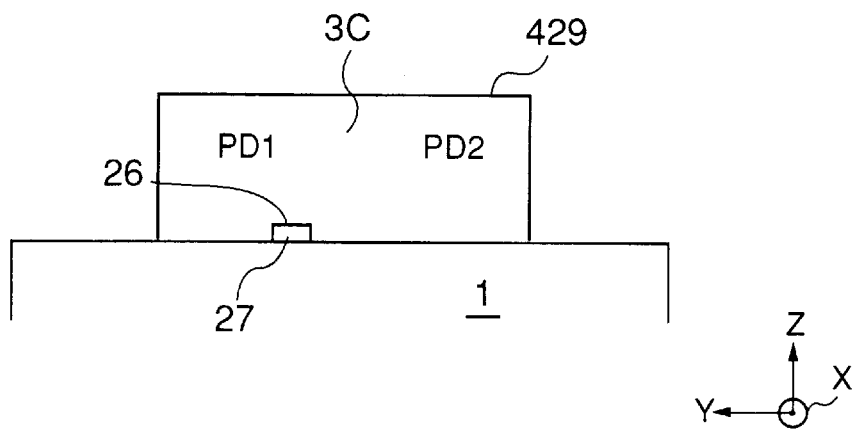

FIG. 33E shows the optical module 329 of FIG. 33E in a rear view.

Referring to FIG. 33E, the photoreception device 429 is mounted on the support substrate 1 by first engaging the guide groove 26 with the corresponding guide rail 27 at a coarse position slightly away from the edge surface 13A of the optical waveguide 13. Next, the photoreception device 429 is slid forward until the front surface 3D is abutted to the edge surface 13A of the optical waveguide 13. Thereby, the desired positioning is possible in the X- and Y-directions without a substantial adjustment. Further, it should be noted that no degree of freedom exists in the photoreception device 429 thus mounted, about the Z-axis.

It is also possible to modify the construction of FIGS. 33D and 33E such that the guide rail 27 is provided on the bottom surface of the photoreception device 429 in engagement with the guide groove 26, which is provided on the support substrate 1. Further, it is possible to form the guide groove 26 and the guide rail 27 to have a V-shaped cross-sectional form.

Hereinafter, various optical modules that includes a photoreception device in direct connection with an optical fiber will be described with reference to FIGS. 34–36.

[THIRTIETH EMBODIMENT]

Figure 34:
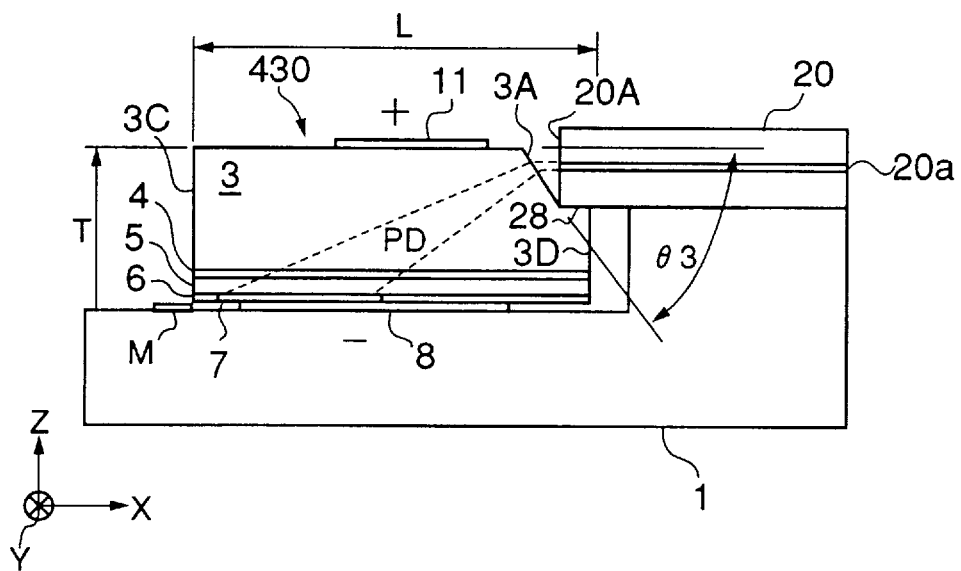
FIG. 34 is a diagram showing the construction of an optical module according to a thirtieth embodiment of the present invention.

FIG. 34 shows the construction of an optical module 330 according to a thirtieth embodiment of the present invention in a cross-sectional view, wherein those parts corresponding to the parts described previously are designated by the same reference numerals and the description thereof will be omitted.

Referring to FIG. 34, the optical module 330 includes a photoreception device 430 mounted on the support substrate 1 in a face-down state similarly to the photoreception device 408 of FIG. 12, wherein the photoreception device 430 has a construction similar to the photoreception device 408 of FIG. 12 except that the rear surface 3C of the photoreception device 430 is defined by a flat cleaved surface and is aligned to the marker M on the support substrate 1 similarly to the embodiment of FIGS. 28A and 28B. Further, the photoreception device 430 has the front surface 3D at a slightly advanced position, and there is formed a small horizontal top surface 28 on such a forwardly projecting part defined by the front surface 3D. Further, the oblique surface 3A of the photoreception device 430 is formed to have an oblique angle $\Theta_3$ that is slightly smaller than the oblique angle $\Theta_1$ of FIG. 4A. In correspondence to this, the refraction angle of the optical beam refracted by the oblique surface 3A is slightly larger than the photoreception device 408. Further, the photoreception device 430 has a slightly increased height T and a slightly decreased length L as compared with the device 408.

On the other hand, the support substrate 1 is formed to have an elevated part at the front side of the photoreception device 430, and a V-shaped groove (not shown) is formed on such an elevated part of the support substrate 1. Thereby, the V-shaped groove is used to hold the optical fiber 20 such that the edge surface 20A of the optical fiber 20 engages with the oblique surface 3A of the photoreception device 430. By holding the optical fiber 20 in such a V-shaped groove, it is possible to position the optical fiber 20 properly in the Y-direction. The engagement of the optical fiber 20 and the photoreception device 430 is achieved merely by sliding the optical fiber 20 along the V-shaped groove until the edge surface 20A contacts with the foregoing oblique surface 3A of the photoreception device 430. As a result of such a simple alignment process, the core 20a is aligned properly with the oblique surface 3A.

In the optical module 330, it is illustrated in FIG. 34 that the photoreception device 430 is connected to the support substrate 1 by the p-type electrode 8 that has an area slightly larger than an area of the p-type diffusion region 7. Thereby, it is illustrated as if the electrode 8 contacts directly with the InP layer 6 of the n⁻-type. This, however, is merely a problem of illustration and the InP layer 6 is actually insulated from the electrode 8 by a thin insulation film of which illustration is omitted for the sake of simplicity.

[THIRTY-FIRST EMBODIMENT]

Figure 35:
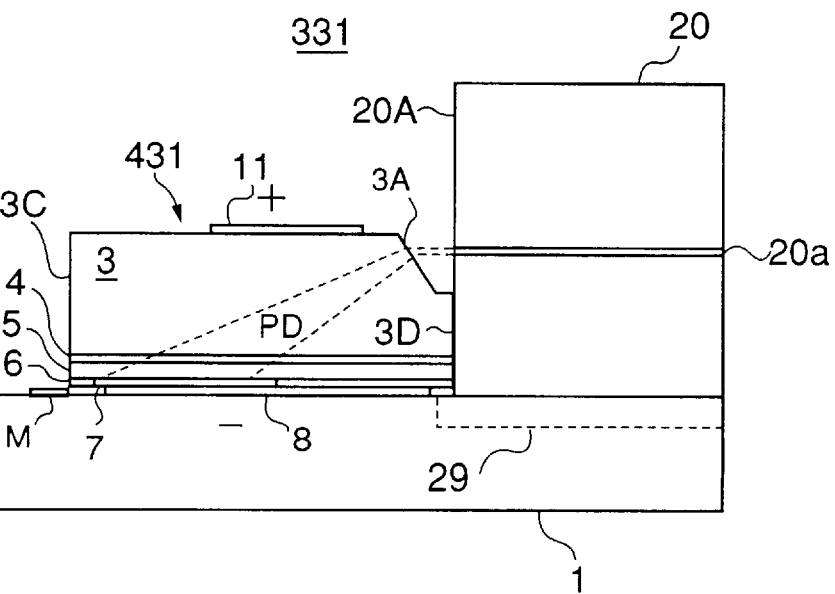
FIG. 35 is a diagram showing the construction of an optical module according to a thirty-first embodiment of the present invention.

FIG. 35 shows the construction of an optical module 331 according to a thirty-first embodiment of the present invention in a cross-sectional view, wherein those parts corresponding to the parts described previously are designated by the same reference numerals and the description thereof will be omitted.

Referring to FIG. 35, the optical module 331 includes a photoreception device 430 on the support substrate 1, wherein the photoreception device 431 is substantially identical with the photoreception device 430 of FIG. 34 and is mounted on the support substrate 1 similarly. On the other hand, the support substrate 1 is formed with a V-shaped groove 29 for accepting the optical fiber 20 that may have a large diameter. In this case, too, the desired optical alignment is achieved between the core 20a and the oblique surface 4A by sliding the optical fiber 20 along the groove 29 until the edge surface 20A engages with the oblique surface 4A.

[THIRTY-SECOND EMBODIMENT]

Figure 36:
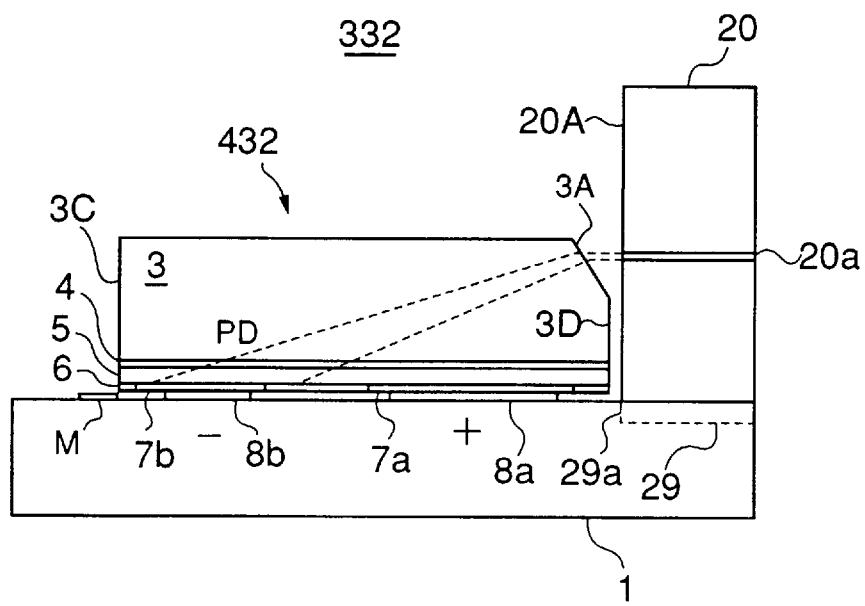
FIG. 36 is a diagram showing the construction of an optical module according to a thirty-second embodiment of the present invention.

FIG. 36 shows the construction of an optical module 332 according to a thirty-second embodiment of the present invention in a cross sectional view, wherein those parts corresponding to the parts described previously are designated by the same reference numerals and the description thereof will be omitted.

Referring to FIG. 36, the optical module 332 includes a photoreception device 432 on the support substrate 1, wherein the photoreception device 432 is substantially identical with the photoreception device 422 of FIG. 25A, except that the photoreception device 432 is mounted in a face-down state and the rear surface 3C is defined by a cleaved surface. Thus, the photoreception device 432 is mounted on the support substrate 1 similarly to the embodiment of FIG. 34.

In the optical module 332, the support substrate 1 carries the V-shaped groove 29 similarly to the embodiment of FIG. 35, and the optical fiber 20 is mounted on the V-shaped groove 29 such that the edge surface 20A of the optical fiber 20 is abutted to the vertical front surface 3D for the proper alignment of the core 20a to the oblique surface 3A.

Next, a description will be made about an optical unit in which the foregoing optical module described heretofore is mounted on a case typically formed of a metal, a ceramic or a plastic, in connection with a commercially available optical fiber connector or a optical fiber cable.

[THIRTY-THIRD EMBODIMENT]

FIGS. 37A–37H are diagrams showing the assembling process of an optical unit according to a thirty-third embodiment of the present invention, wherein those parts corresponding to the parts described previously are designated by the same reference numerals and the description thereof will be omitted.

It should be noted that the optical unit of the present embodiment achieves an optical coupling of the optical module described heretofore in any of the preceding embodiments with a short optical fiber piece designated by the optical fiber 20 and further with a commercially available optical fiber connector 54 held in a glass capillary 53 that in turn is held in a hollow holder 51.

Figure 37A:
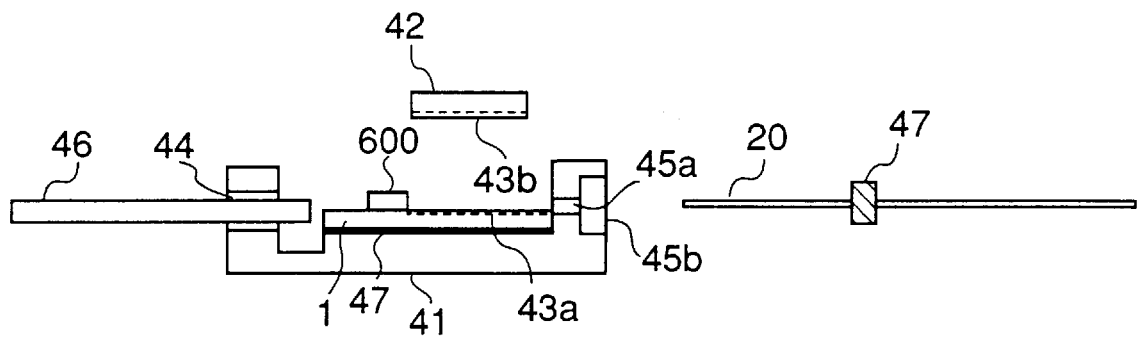
Figure 37B:
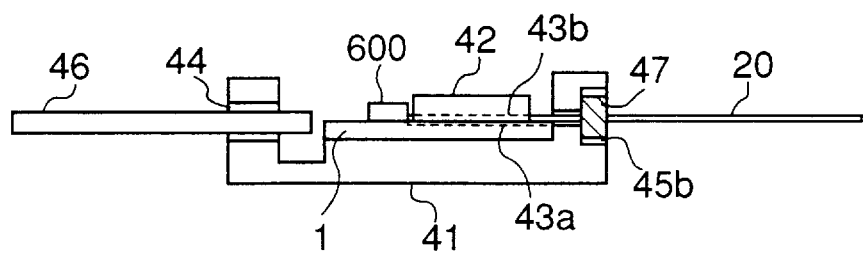

Referring to FIG. 37A, an optical device 600, which may be a laser diode or a photoreception device of the type described previously, is mounted on the support substrate 1 carrying a V-shaped groove 43a to form an optical module. The optical module thus formed is then seated upon a stage part of a metal case 41, via an intervening solder sheet 47, wherein the metal case 41 includes a front insertion opening 45a at a front side thereof for accepting an optical fiber. Further, the metal case 41 includes a rear insertion opening 44 at a rear side thereof for accepting an electric cable 46 that may include various power cables and signal cables. The metal case 41 thus carrying the optical module is then heated while applying a load to the support substrate 1 such that the support substrate 1 is firmly soldered upon the case 41.

Next, the optical fiber 20 is inserted into the front opening 45a of the metal case 41 and is held upon the support substrate 1 by a metal piece 42 including a V-shaped groove 43b such that the optical fiber 20 is accepted into the V-shaped groove 43b. Further, a solder ring 47 provided on the optical fiber 20 is seated upon a predetermined, corresponding depression 45b provided on the metal case 41 so as to surround the foregoing opening 45a. See FIG. 37B.

Figure 37C:
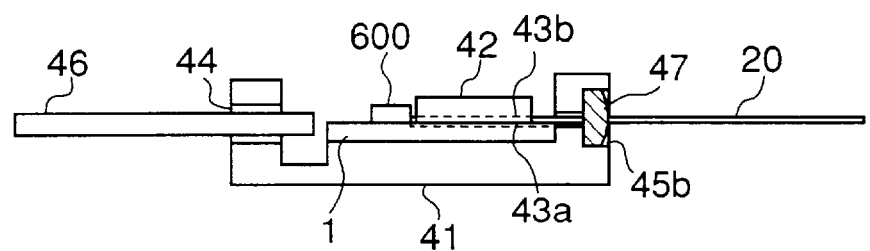

Next, in the step of FIG. 37C, the metal case 41 is heated while applying a load to the metal piece 42 such that the metal piece 42 is soldered upon the support substrate 1. Simultaneously, the solder ring 47 causes a reflowing, and the optical fiber 20 is fixed upon the metal case 41.

Next, in the step of FIG. 37D, a necessary wire bonding process is conducted between the cable 46 and the optical element 600, and a metal lid 48 of the same material as the metal case 41 is mounted on the case 41 to form a hermetic seal.

Further, the hollow holder 51 mentioned previously is mounted on the metal case 41 at the front side thereof by a welding process in the step of FIG. 37E, and the free end of the optical fiber 20 is inserted into the glass capillary 53 provided on a base part 51a of the holder 51 in correspondence to a region 52.

Next, in the step of FIG. 37F, an optical fiber 54 is placed on the base part 51a of the holder 51 and a cable core 54c of the optical fiber 54 is inserted into the glass capillary 53 from the right direction. Thereafter, the optical fiber 20 and the cable core 54c are connected by filling an adhesive from an opening 53a provided on the capillary 53.

Finally, an adhesive such as a urethane resin or polyimide resin, or alternatively of a silicone resin, is filled at both sides of the glass capillary 53 to form a resin cover 56, and a top cover 51b is provided on the structure thus formed so as to seal the interior of the hollow holder 51 together with the base part 51a as indicated in FIG. 37G. The optical fiber cable 54 carries a standard optical connector at a free end thereof and forms a so-called pigtail optical unit.

In the foregoing optical unit, it is of course possible to provide an optical waveguide corresponding to the optical waveguide 13 between the optical device 600 and the optical fiber 20.

FIG. 37H shows the transversal cross-section of the optical unit of FIG. 37G taken along a line A—A'.

Referring to FIG. 37H, it will be noted that the hollow holder 51 is formed by the engagement of the base part 51a and the top part 51b and holds therein the cable core 54c of the optical cable 54 in the glass capillary 53.

[THIRTY-FOURTH EMBODIMENT]

Figure 38:
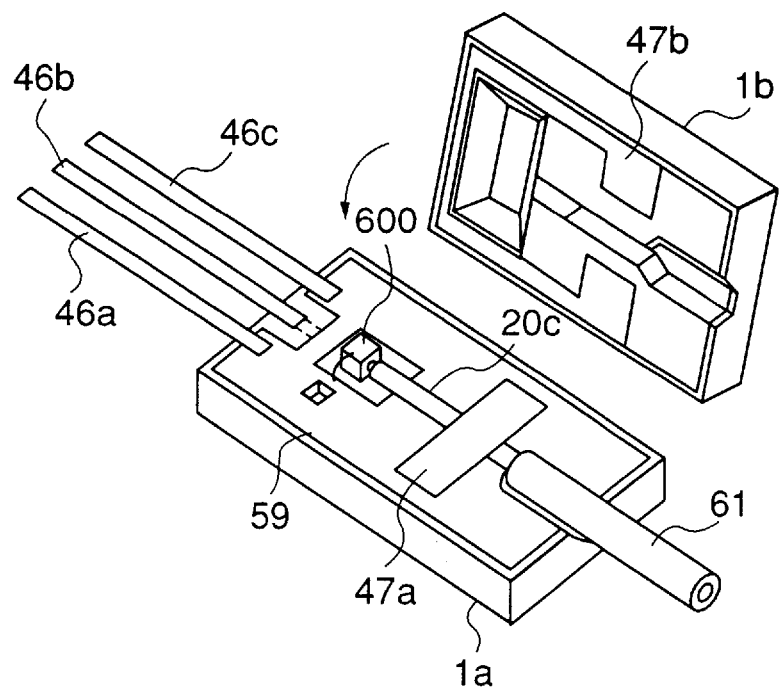
FIG. 38 is a diagram showing the construction of an optical unit according to a thirty-fourth embodiment of the present invention.
Figure 39:
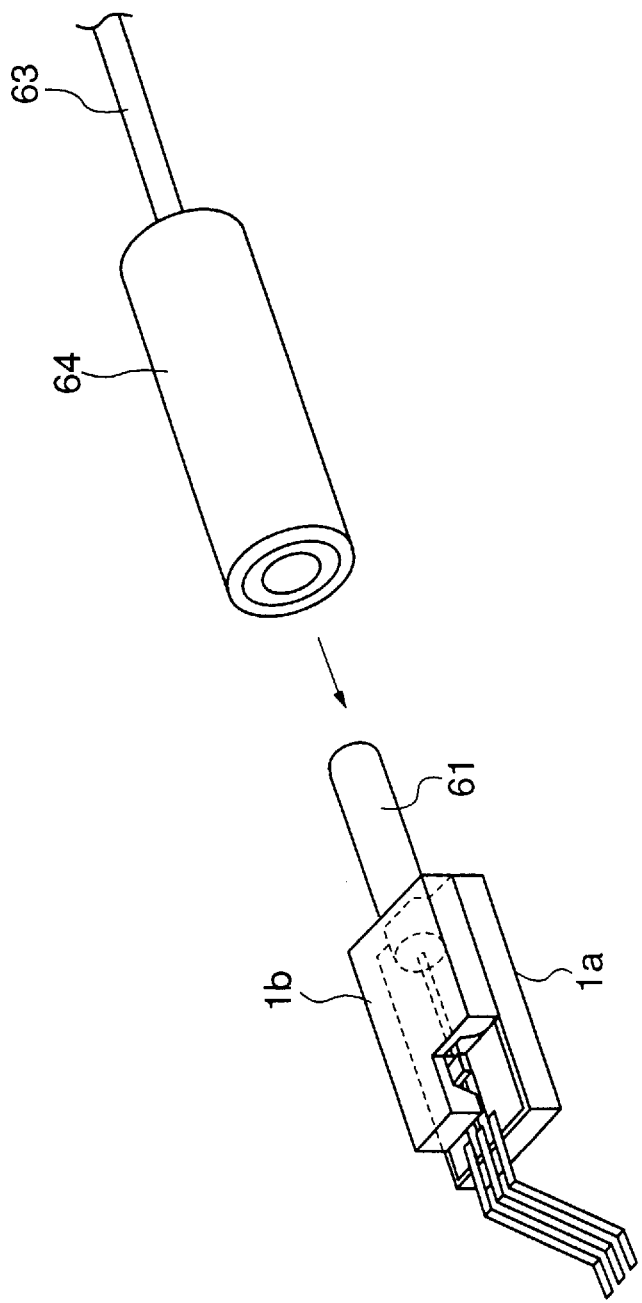
FIG. 39 is another diagram showing the construction of an optical unit according to the thirty-fourth embodiment.
Figure 40:
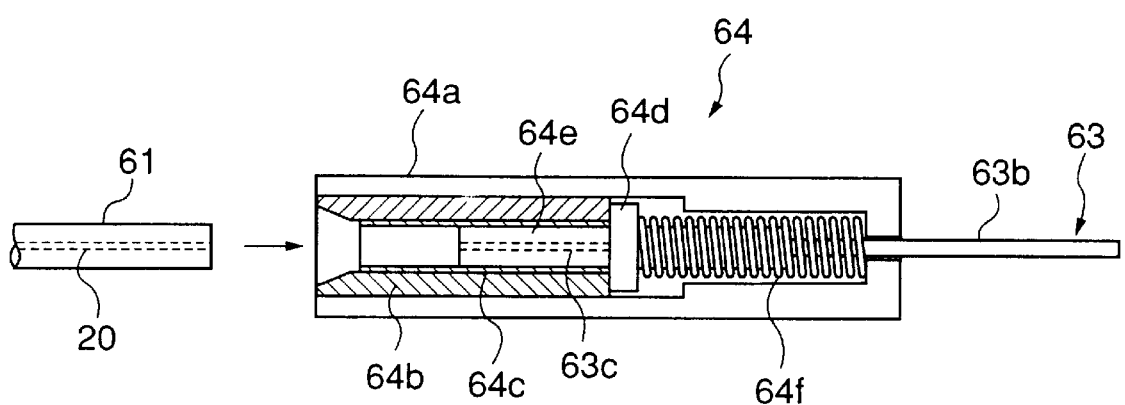
FIG. 40 is a further diagram showing the construction of an optical unit according to the thirty-fourth embodiment.

FIGS. 38–40 show the construction of an optical unit according to a thirty-fourth embodiment of the present invention, wherein those parts corresponding to the parts described previously are designated by the same reference numerals and the description thereof will be omitted.

Referring to FIG. 38, the optical unit includes a lower substrate 1a of Si on which the optical device 600 is mounted. Further, the Si substrate 1a is formed with a V-shaped groove at a front side of the optical device 600 for accommodating the optical fiber 20. Furthermore, the Si substrate 1a is formed with another, larger V-shaped groove in continuation with the foregoing V-shaped groove for accepting a first ferrule 61 provided at the free end of the optical fiber 20. The optical fiber 20 is held on the substrate 1a by means of a solder sheet 47a.

It should be noted that the top surface of the Si substrate 1a is covered by an electrode layer not shown, and another electrode layer 59 is provided thereon with an intervening insulation film interposed therebetween. Thereby, the solder sheet 47a is contacted with the electrode layer 59

On the Si substrate 1a thus formed, another Si substrate 1b is provided, wherein the Si substrate 1b is formed with corresponding depressions and V-shaped grooves for accommodating the optical device 600 as well as the optical fiber 20 and the ferrule 61 on a lower surface thereof. Further, the Si substrate 1b carries, on the lower major surface thereof, a solder layer 47b in correspondence to the solder sheet 47a.

By disposing the upper substrate 1b on the lower substrate 1a and heating the structure thus formed while urging the upper substrate 1b firmly to the lower substrate 1a firmly, an optical module carrying the ferrule 61 thereon is obtained.

In the optical module thus formed, it should be noted that the free end of the optical fiber 20 forms a flush surface with the end surface of the ferrule 61. Thus, by engaging an optical connector 64 provided at an end of an optical fiber 63 with the ferrule 61 as indicated in FIG. 39, it is possible to achieve an efficient optical coupling between the optical module and the optical fiber 63.

FIG. 40 shows the construction of the optical connector 64 in a cross-sectional view.

Referring to FIG. 40, the optical connector 64 includes a cylindrical steel housing 64a in which a molded resin sleeve 64b is fitted. Further, an inner sleeve 64c of phosphor bronze is fitted inside the resin sleeve 64b, and a second ferrule 64e having a flange part 64d is provided inside the inner sleeve 64b. The flange part 64b is urged by a coil spring 64f.

The optical fiber 63b has an end surface forming a flush surface with the end surface of the ferrule 64e and carries a standard optical connector not shown at an opposite end thereof. The exposed part of the optical fiber 63b is covered by a resin coating.

It should be noted that the molded resin sleeve 64n is fixed in the housing 64a and holds the flange 64d of the ferrule 64e urged by the coil spring 64f in the left direction. Upon insertion of the first ferrule 61 into the inner sleeve 64c in this state, the second ferrule 64e is pushed in the right direction in constant engagement with the ferrule 61. Thereby, the optical beam 20 held by the ferrule 61 engages continuously with the corresponding end surface of the optical fiber 63c held in the ferrule 64e and an excellent optical coupling is maintained therebetween.

[THIRTY-FIFTH EMBODIMENT]

Figure 41A:
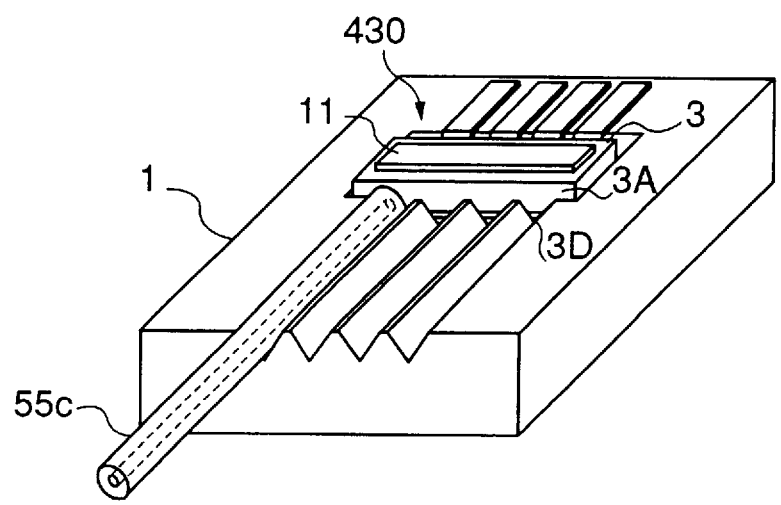
FIGS. 41A and 41B are diagrams showing the construction of an optical unit according to a thirty-fifth embodiment of the present invention.
Figure 41B:
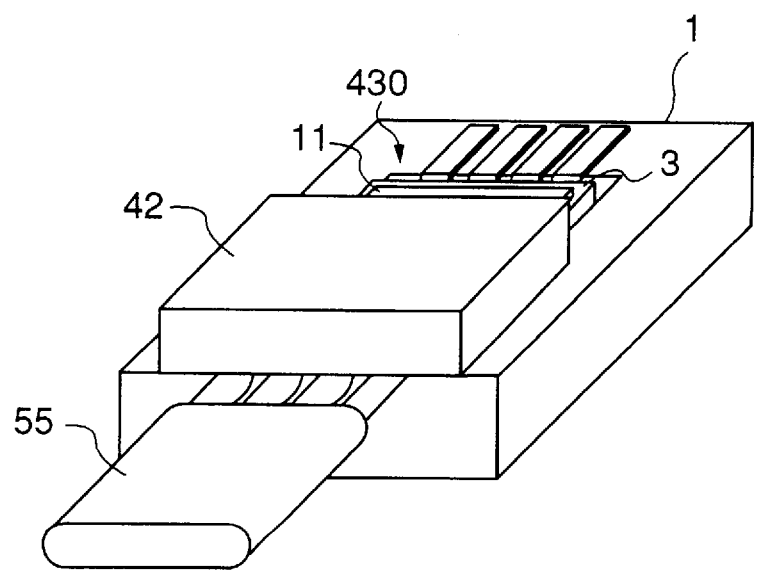

FIGS. 41A and 41B show the construction of an optical unit according to a thirty-fifth embodiment of the present invention, wherein those parts corresponding to the parts described previously are designated by the same reference numerals and the description thereof will be omitted.

Referring to FIG. 41A, the photoreception device 430 of FIG. 34, for example, is mounted on the support substrate 1 of Si, wherein it should be noted that the photoreception device 430 includes four photodiodes PD parallel with each other in correspondence to four optical channels. In correspondence to the four photodiodes PD, there are formed four V-shaped grooves on the support substrate 1 such that each of the V-shaped grooves holds an optical fiber 55c such that the edge surface of the optical fiber 55c engages the refraction surface 3A of the photoreception device 430. Similarly, other optical fiber cables are mounted.

After the optical fiber cables are thus mounted, a press plate 42 of Si is provided from the upward direction as indicated in FIG. 41B, such that the press plate 42 urges the optical fiber cables to the support substrate 1. By fixing the press plate 42 to the support substrate 1, it is possible to obtain the optical unit of the array type easily.

It should be noted that the construction of the optical module described heretofore with reference to FIGS. 28–36 is applicable also to other optical modules that carries thereon other various photoreception devices.

Further, the present invention is not limited to the embodiments described heretofore, but various variations and modifications may be made without departing from the scope of the invention.

What is claimed is:

1. A photoreception device, comprising:
    a device substrate having a first principal surface and a second principal surface;
    a photodetection region formed at a side of said first principal surface of said device substrate, said photodetection region including a diffusion region formed in the vicinity of said first principal surface, said diffusion region thereby forming a junction;
    an oblique surface formed on a part of said device substrate with an oblique angle with respect to said second principal surface, such that said oblique surface causes a deflection of an optical beam incident thereto to said photodetection region;

a first electrode provided at said side of said first principal surface of said device substrate in correspondence to said photodetection region in contact with said diffusion region; and a second electrode provided at a side of said second principal surface of said device substrate for reversely biasing said junction of said photodetection region, wherein at least a portion of said device substrate is interposed between said first principal surface and said second principal surface.

2. A photoreception device as claimed in claim 1, wherein said oblique surface is a flat surface.

3. A photoreception device as claimed in claim 1, wherein said oblique surface is a curved surface.

4. A photoreception device as claimed in claim 1, wherein said device substrate has a vertical side wall for receiving said optical beam at a front side of said device substrate, and wherein said oblique surface is provided on said device substrate at a rear side of said device substrate, said oblique surface carrying a reflective coating thereon.

5. A photoreception device as claimed in claim 1, wherein said photodetection region is provided at a plurality of locations at said side of said first principal surface of said device substrate, each of said plurality of photodetection regions detecting an optical beam incident thereto along an optical path that is different from each other.

6. A photoreception device as claimed in claim 1, wherein said photodetection region includes an optical absorption layer as a part thereof, wherein said optical absorption layer has a bandgap energy and a thickness set such that an optical radiation having a wavelength of said optical beam to be detected is selectively absorbed as compared with an optical radiation having a longer wavelength.

7. A photoreception device as claimed in claim 1, wherein said device substrate carries on said first principal surface thereof a $\lambda/4$-multilayer reflection filter such that said $\lambda/4$-multilayer reflection filter is interposed between said device substrate and said photodetection region.

8. A photoreception device, comprising:

a device substrate having a principal surface;

a photodetection region formed adjacent to said principal surface of said device substrate, said photodetection region including a diffusion region formed in the vicinity of said principal surface, said diffusion region thereby forming a junction;

an oblique surface formed on a part of said device substrate with an oblique angle with respect to said principal surface, such that said oblique surface causes a deflection of an optical beam incident thereto to said photodetection region;

a first electrode provided adjacent to said principal surface of said device substrate in correspondence to said photodetection region in contact with said diffusion region; and a second electrode provided adjacent to said principal surface of said device substrate in direct electrical contact therewith, for reversely biasing said junction of said photodetection region, said second electrode covering substantially a remaining area of said principal surface.

9. A photoreception device as claimed in claim 8, wherein said photoreception device includes a contact structure adjacent to said principal surface of said device substrate, said contact structure exposing a semiconductor layer located underneath said diffusion region, said second electrode extending along said contact structure and contacting said semiconductor layer electrically.

10. A photoreception device as claimed in claim 8, wherein said oblique surface is a flat surface.

11. A photoreception device as claimed in claim 8, wherein said oblique surface is a curved surface.

12. A photoreception device as claimed in claim 8, wherein said device substrate has a vertical side wall for receiving said optical beam at a front side of said device substrate, and wherein said oblique surface is provided on said device substrate at a rear side of said device substrate, said oblique surface carrying a reflective coating thereon.

13. A photoreception device as claimed in claim 8, wherein said photodetection region is provided at a plurality of locations at said side of said first principal surface of said device substrate, each of said plurality of photodetection regions detecting an optical beam incident thereto along an optical path that is different from each other.

14. A photoreception device as claimed in claim 8, wherein said photodetection region includes an optical absorption layer as a part thereof, wherein said optical absorption layer has a bandgap energy and a thickness set such that an optical radiation having a wavelength of said optical beam to be detected is selectively absorbed as compared with an optical radiation having a longer wavelength.

15. A photoreception device as claimed in claim 8, wherein said device substrate carries on said first principal surface thereof a $\lambda/4$-multilayer reflection filter such that said $\lambda/4$-multilayer reflection filter is interposed between said device substrate and said photodetection region.

16. An optical module, comprising:

a support substrate; and a photoreception device provided on said support substrate, said photoreception device comprising: a device substrate having a first principal surface and a second principal surface; a photodetection region formed at a side of said first principal surface of said device substrate, said photodetection region including a diffusion region formed in the vicinity of said first principal surface, said diffusion region thereby forming a junction; an oblique surface formed on a part of said device substrate with an oblique angle with respect to said second principal surface, such that said oblique surface causes a deflection of an optical beam incident thereto to said photodetection region; a first electrode provided at said side of said first principal surface of said device substrate in correspondence to said photodetection region in contact with said diffusion region; and a second electrode provided at a side of said second principal surface of said device substrate for reversely biasing said junction of said photodetection region;

wherein said photoreception device is mounted upon said support substrate by connecting either one of said first and second electrodes to said support substrate, and wherein at least a portion of said device substrate is interposed between said first principal surface and said second principal surface.

17. An optical module, comprising:

a support substrate; and a photoreception device provided on said support substrate, said photoreception device comprising: a device substrate having a principal surface; a photodetection region formed adjacent to said principal surface of said device substrate, said photodetection region including a diffusion region formed in the vicinity of said principal surface, said diffusion region thereby forming a junction; an oblique surface formed on a part of said device substrate with an oblique angle with respect to said principal surface, such that said oblique surface causes a deflection of an optical beam incident thereto to said photodetection region; a first electrode provided adjacent to said principal surface of said device substrate in correspondence to said photodetection region in contact with said diffusion region; and a second electrode provided adjacent to said principal surface of said device substrate in direct electrical contact therewith, for reversely biasing said junction of said photodetection region, said second electrode covering substantially a remaining area of said principal surface;

wherein said photoreception device is mounted upon said support substrate by connecting said first and second electrodes upon said support substrate.

18. An optical module, comprising:

a support substrate; and a photoreception device provided on said support substrate, said photoreception device comprising: a device substrate having a first principal surface and a second principal surface; a photodetection region formed at a side of said first principal surface of said device substrate, said photodetection region including a diffusion region formed in the vicinity of said first principal surface, said diffusion region thereby forming a junction; an oblique surface formed on a part of said device substrate with an oblique angle with respect to said first principal surface, such that said oblique surface causes a deflection of an optical beam incident thereto to said photodetection region; a first electrode provided at said side of said first principal surface of said device substrate in correspondence to said photodetection region in contact with said diffusion region; and a second electrode provided at a side of said second principal surface of said device substrate in electrical contact therewith, for reversely biasing said junction of said photodetection region;

wherein said photoreception device is mounted upon said support substrate by a bonding medium provided on said second principal surface of said device substrate, and wherein at least a portion of said device substrate is interposed between said first principal surface and said second principal surface.

19. An optical module, comprising:

a support substrate; and a photoreception device provided on said support substrate, said photoreception device comprising: a device substrate having a first principal surface and a second principal surface; a photodetection region formed at a side of said first principal surface of said device substrate, said photodetection region including a diffusion region formed in the vicinity of said first principal surface, said diffusion region thereby forming a junction; an oblique surface formed on a part of said device substrate with an oblique angle with respect to said principal surface, such that said oblique surface causes a deflection of an optical beam incident thereto to said photodetection region;

said device substrate having a flat reflecting side wall extending vertically to a principal surface of said support substrate in a state in which said photoreception device is mounted upon said support substrate;

said support substrate carrying thereon a marker in alignment with said flat reflecting side wall of said device substrate, wherein said marker is reflected by said flat reflecting side wall to assist in said alignment.

20. An optical module, comprising:

a support substrate carrying a projection; and a photoreception device provided on said support substrate, said photoreception device comprising: a device substrate having a first principal surface and a second principal surface; a photodetection region formed at a side of said first principal surface of said device substrate, said photodetection region including a diffusion region formed in the vicinity of said first principal surface, said diffusion region thereby forming a junction; and an oblique surface formed on a part of said device substrate with an oblique angle with respect to said second principal surface, such that said oblique surface causes a deflection of an optical beam incident thereto to said photodetection region;

said device substrate having a depression on said second principal surface thereof;

said support substrate carrying said photoreception device thereon in a state that said projection on said support substrate is in engagement with said depression of said device substrate.

21. An optical module, comprising:

a support substrate; and a photoreception device provided on said support substrate, said photoreception device comprising: a device substrate having a first principal surface and a second principal surface; a photodetection region formed at a side of said first principal surface of said device substrate, said photodetection region including a diffusion region formed in the vicinity of said first principal surface, said diffusion region thereby forming a junction; and an oblique surface formed on a part of said device substrate with an oblique angle with respect to said second principal surface, such that said oblique surface causes a deflection of an optical beam incident thereto to said photodetection region;

said device substrate having a flat side wall extending vertically to a principal surface of said support substrate in a state in which said photoreception device is mounted upon said support substrate;

said support substrate carrying on said principal surface thereof a projection in engagement with said flat side wall of said device substrate.

22. An optical module, comprising:

a support substrate;

an optical waveguide provided on said support substrate; and a photoreception device provided on said support substrate, said photoreception device comprising: a device substrate having a first principal surface and a second principal surface; a photodetection region formed at a side of said first principal surface of said device substrate, said photodetection region including a diffusion region formed in the vicinity of said first principal surface, said diffusion region thereby forming a junction; and an oblique surface formed on a part of said device substrate with an oblique angle with respect to said second principal surface, such that said oblique surface causes a deflection of an optical beam incident thereto to said photodetection region;

said device substrate having a flat side wall extending vertically with respect to a principal surface of said support substrate in a state in which said photoreception device is mounted upon said support substrate;

said support substrate carrying said optical waveguide thereon such that an edge surface of said optical waveguide engages with said flat side wall of said device substrate, wherein said oblique surface extends from said flat side wall.

23. An optical module as claimed in claim 22, wherein said photoreception device carries on a top surface thereof a positioning marker adjacent to said flat side wall.

24. An optical module as claimed in claim 22, wherein said support substrate carries thereon a projection extending in a direction of an optical axis of said optical waveguide, said photoreception device carrying a corresponding groove such that said projection of said support substrate engages with said groove when said photoreception device is mounted upon said support substrate.

25. An optical module, comprising:

a support substrate;

an optical waveguide structure provided on said support substrate for guiding an optical signal therethrough;

a photoreception device provided on said support substrate, said photoreception device comprising: a device substrate having a first principal surface and a second principal surface; a photodetection region formed at a side of said first principal surface of said device substrate, said photodetection region including a diffusion region formed in the vicinity of said first principal surface, said diffusion region thereby forming a junction; and an oblique surface formed on a part of said device substrate with an oblique angle with respect to said second principal surface, such that said oblique surface causes a deflection of an optical beam incident thereto to said photodetection region; and a light emitting device provided on said support substrate;

said photoreception device and said light emitting device being disposed in an optical alignment with said optical waveguide structure such that an optical beam emitted from said optical waveguide structure impinges upon said oblique surface of said photoreception device and such that an optical beam emitted from said light emitting device enters said optical waveguide structure;

said photoreception device and said light emitting device being so disposed that an optical beam emitted from said light emitting device further impinges upon said oblique surface of said photoreception device.

26. An optical module, comprising:

a support substrate; and a photoreception device provided on said support substrate, said photoreception device comprising: a device substrate having a first principal surface and a second principal surface; a photodetection region formed at a side of said first principal surface of said device substrate, said photodetection region including a diffusion region formed in the vicinity of said first principal surface, said diffusion region thereby forming a junction; and an oblique surface formed on a part of said device substrate with an oblique angle with respect to said second principal surface, such that said oblique surface causes a deflection of an optical beam incident thereto to said photodetection region;

said device substrate carrying, on said second principal surface, a vent structure communicating with a side wall different from the part of said device substrate where said oblique surface is formed, thereby allowing a medium used for bonding said device substrate on said support substrate to escape.

27. An optical unit, comprising:

a package substrate;

an optical waveguide provided on said package substrate, said optical waveguide having a first edge surface and a second opposing edge surface;

a photoreception device provided on said package substrate, said photoreception device comprising: a device substrate having a first principal surface and a second principal surface; a photodetection region formed at a side of said first principal surface of said device substrate, said photodetection region including a diffusion region formed in the vicinity of said first principal surface, said diffusion region thereby forming a junction at an interface to said device substrate; and an oblique surface formed on a part of said device substrate with an oblique angle with respect to said second principal surface, such that said oblique surface causes a deflection of an optical beam incident thereto to said photodetection region;

said photoreception device being disposed on said package substrate such that said oblique surface of said device substrate establishes an optical coupling with said first edge surface of said optical waveguide;

a first optical fiber having first and second edge surfaces, said first optical fiber being disposed on said package substrate such that said first edge surface of said first optical fiber establishes an optical coupling with said second edge surface of said optical waveguide, said first optical fiber having an exposed outer surface;

a second optical fiber having first and second edge surfaces respectively at first and second ends;

a holder holding said second end of said first optical fiber and said first end of said second optical fiber, said holder being disposed on said package substrate such that said first edge surface of said second optical fiber established an optical coupling with said second edge surface of said first optical fiber; and an optical coupler provided on said second end of said second optical fiber.

28. An optical unit, comprising:

a package substrate;

an optical waveguide provided on said package substrate, said optical waveguide having a first edge surface and a second opposing edge surface;

a photoreception device provided on said package substrate, said photoreception device comprising: a device substrate having a first principal surface and a second principal surface; a photodetection region formed at a side of said first principal surface of said device substrate, said photodetection region including a diffusion region formed in the vicinity of said first principal surface, said diffusion region thereby forming a junction; and an oblique surface formed on a part of said device substrate with an oblique angle with respect to said second principal surface, such that said oblique surface causes a deflection of an optical beam incident thereto to said photodetection region;

said photoreception device being disposed on said package substrate such that said oblique surface of said device substrate establishes an optical coupling with said first edge surface of said optical waveguide;

an optical fiber having first and second edge surfaces, said optical fiber being disposed on said package substrate such that said first edge surface of said optical fiber establishes an optical coupling with said second edge surface of said optical waveguide, said optical fiber having an exposed outer surface; and a ferrule holding said second end of said optical fiber, said ferrule having an end surface flush with said second end of said optical fiber.

29. An optical unit, comprising:

a package substrate;

an optical waveguide provided on said package substrate, said optical waveguide having a first edge surface and a second opposing edge surface;

a photoreception device provided on said package substrate, said photoreception device comprising: a device substrate having a first principal surface and a second principal surface; a photodetection region formed at a side of said first principal surface of said device substrate, said photodetection region including a diffusion region formed in the vicinity of said first principal surface, said diffusion region thereby forming a junction; and an oblique surface formed on a part of said device substrate with an oblique angle with respect to said second principal surface, such that said oblique surface causes a deflection of an optical beam incident thereto to said photodetection region;

said photoreception device being disposed on said package substrate such that said oblique surface of said device substrate establishes an optical coupling with said first edge surface of said optical waveguide;

an optical fiber held on said package substrate, said optical fiber having an end establishing an optical coupling with said second edge surface of said optical waveguide; and a lid member provided on said package substrate so as to cover said optical waveguide including said photoreception device, said optical waveguide and said end of said optical fiber, said lid member and said package substrate forming a hermetic seal.

30. The optical module of claim 17, wherein said photoreception device includes a contact structure adjacent to said principal surface of said device substrate, said contact structure exposing a semiconductor layer located underneath said diffusion region, said second electrode extending along said contact structure and contacting said semiconductor layer electrically.

\* \* \* \* \*